(12) United States Patent
Wang et al.

(10) Patent No.: US 11,319,645 B2
(45) Date of Patent: May 3, 2022

(54) METHODS AND DEVICES FOR GROWING OXIDE CRYSTALS IN OXYGEN ATMOSPHERE

(71) Applicant: MEISHAN BOYA ADVANCED MATERIALS CO., LTD., Sichuan (CN)

(72) Inventors: Yu Wang, Meishan (CN); Weiming Guan, Meishan (CN); Min Li, Meishan (CN)

(73) Assignee: MEISHAN BOYA ADVANCED MATERIALS CO., LTD., Meishan (CN)

( * ) Notice: Subject to any disclaimer, the term of this patent is extended or adjusted under 35 U.S.C. 154(b) by 0 days.

(21) Appl. No.: 16/903,334

(22) Filed: Jun. 16, 2020

(65) Prior Publication Data

US 2021/0054527 A1 Feb. 25, 2021

Related U.S. Application Data

(63) Continuation of application No. PCT/CN2019/101693, filed on Aug. 21, 2019.

(51) Int. Cl.
C30B 29/22 (2006.01)
C01B 33/20 (2006.01)
C30B 15/02 (2006.01)

(52) U.S. Cl.
CPC .............. C30B 29/22 (2013.01); C01B 33/20 (2013.01); C30B 15/02 (2013.01); *C01P 2002/52* (2013.01)

(58) Field of Classification Search
CPC ......... C30B 29/22; C30B 15/02; C01B 33/20; C01P 2002/52
See application file for complete search history.

(56) References Cited

U.S. PATENT DOCUMENTS 5,993,539 A * 11/1999 Izumi .................... C30B 29/06
117/13
6,278,832 B1 8/2001 Zagumennyi et al.
(Continued)

FOREIGN PATENT DOCUMENTS

CN 1563517 A 1/2005
CN 101377020 A 3/2009
(Continued)

OTHER PUBLICATIONS

Yan Chengfeng et al., Crystal Growth and Optical Characterization of Large-sized Cerium-doped Lu1.6Y0.4SiO5, Journal of Inorganic Materials, 20(6): 1301-1305, 2005.
(Continued)

*Primary Examiner* — Hua Qi
(74) *Attorney, Agent, or Firm* — Metis IP LLC

(57) ABSTRACT

The present disclosure discloses a method for growing a crystal in oxygen atmosphere. The method may include compensating a weight of a reactant, introducing a flowing gas, improving a volume ratio of oxygen during a cooling process, providing a heater in a temperature field, and optimizing parameters. According to the method, problems may be solved, for example, cracking and component deviation of the crystal during a crystal growth process, and without oxygen-free vacancy. The method for growing the
(Continued)

crystal may have excellent repeatability and crystal performance consistency.

13 Claims, 7 Drawing Sheets

(56) References Cited

U.S. PATENT DOCUMENTS

| | | | |
|---|---|---|---|
| 6,506,251 B1 * | 1/2003 | Kitagawa | C30B 29/06 117/13 |
| 6,554,898 B2 * | 4/2003 | Lu | C30B 15/14 117/200 |
| 6,818,896 B2 | 11/2004 | Pauwels et al. | |
| 2006/0266277 A1 * | 11/2006 | Usui | C30B 31/08 117/19 |
| 2007/0292330 A1 * | 12/2007 | Kurata | C01B 33/20 423/263 |
| 2008/0213151 A1 * | 9/2008 | Yoshikawa | C30B 15/08 423/263 |
| 2008/0299027 A1 | 12/2008 | Kurata et al. | |
| 2012/0126171 A1 | 5/2012 | Andreaco et al. | |
| 2013/0306874 A1 | 11/2013 | Yoshikawa et al. | |
| 2014/0291580 A1 * | 10/2014 | Zagumennyi | C09K 11/7774 252/301.4 F |
| 2015/0136992 A1 * | 5/2015 | Cohen | C09K 11/7774 250/362 |
| 2016/0002529 A1 * | 1/2016 | Blahuta | G01T 1/2018 250/361 R |
| 2017/0362738 A1 * | 12/2017 | Galazka | C30B 11/006 |

FOREIGN PATENT DOCUMENTS

| | | | |
|---|---|---|---|
| CN | 102492979 A | | 6/2012 |
| CN | 103757702 A | * | 4/2014 |
| CN | 103849933 A | * | 6/2014 |
| CN | 105543963 A | | 5/2016 |
| CN | 103849933 B | | 9/2016 |
| CN | 105986320 A | | 10/2016 |
| CN | 106011998 A | | 10/2016 |
| JP | 2004168613 A | | 6/2004 |

OTHER PUBLICATIONS

First Office Action in Chinese Application No. 201980051053.7 dated Jun. 2, 2021, 24 pages.
First Office Action in Chinese Application No. 202110318220.9 dated Aug. 31, 2021, 16 pages.

* cited by examiner

100

| 110 | Weighting reactants based on a molar ratio of the reactants according to a reaction equation for generating a crystal after a first preprocessing operation is performed on the reactants |

| 120 | Placing reactants on which a second preprocessing operation has been performed into a crystal growth device after an assembly preprocessing operation is performed on at least one component of the crystal growth device |

| 130 | Introducing a flowing gas into the crystal growth device after sealing the crystal growth device |

| 140 | Activating the crystal growth device to grow the crystal based on the Czochralski technique |

FIG. 1

METHODS AND DEVICES FOR GROWING OXIDE CRYSTALS IN OXYGEN ATMOSPHERE

CROSS-REFERENCE TO RELATED APPLICATIONS

This application is a continuation of International Patent Application No. PCT/CN2019/101693 field on Aug. 21, 2019, the entire contents of which are hereby incorporated by reference.

TECHNICAL FIELD

The present disclosure generally relates to the field of crystal growth, and in particular, to methods and devices for growing oxide crystals in oxygen atmosphere.

BACKGROUND

Scintillation crystal is used as an energy conversion medium that can convert ionizing radiation energy (e.g., a gamma-ray, an X-ray) into light energy (e.g., visible light). The scintillation crystal is widely used in nuclear medicine field such as X-ray tomography (CT), positron emission tomography (PET), nuclear detection field such as industrial tomography (e.g., industrial CT), oil well exploration, nuclear physics field, high-energy physics field, environmental detection field, safety monitoring field, weapon fire control and guidance field, etc. Specifically, for the high-energy physics field and/or the nuclear medicine field, it is required that the scintillation crystal has a relatively high light yield, a relatively strong gamma-ray absorption capacity, a relatively short luminescence decay time, a relatively large radiation hardness, density, atomic number, etc. Oxide crystals that meet these requirements are mostly grown in a vacuum single crystal furnace and the whole growth process of the oxide crystals are carried out in an anaerobic environment. After the oxide crystals are obtained, a high-temperature annealing operation may be performed on the oxide crystals to improve the performance of the oxide crystals and increase the light yield of the oxide crystals. The high-temperature annealing operation may improve the performance of the oxide crystal by about 15~30%, but also extends the preparation cycle of the final products. Therefore, it is desirable to provide methods and devices for growing oxide crystals with reduced preparation cycle.

SUMMARY

The present disclosure discloses a method for crystal growth in a flowing gas with rich oxygen. The method for crystal growth has excellent repeatability and crystal performance consistency. According to the method, problems are solved, for example, the volatility of $SiO_2$, cracking and component deviation of the crystal during the crystal growth process, long growth cycle, difficulty of obtaining crystals with uniform scintillation performance and without oxygen-free vacancy.

According to an aspect of the present disclosure, a crystal is provided. A formula of the crystal may be

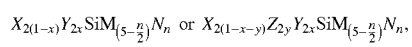

wherein X may consist of at least one of Gd, Lu, La, Yb, Sc, or Y, Y may consist of at least one of Ce, Na, K, Cu, Ag, Mg, Ca, Zn, Sr, Gd, B, Al, Ga, V, Cr, Mn, Fe, Co, Ni, Ti, Ge, Zr, Sn, Hf, La, Pr, Nd, Sm, Eu, Tb, Dy, Ho, Er, Tm, Yb, Y, Pm, or Lu, Z may consist of at least one of Sc, Y, Gd, or Lu, M may consist of at least one of O, C, F, Br, or S, N may consist of at least one of C, F, Br, or S, and x=0.000001~0.06, y=0~1, and n=0~5.

In some embodiments, X may consist of Lu, Y may consist of Ce, Z may consist of Y, and M may consist of O. The formula of the crystal may be

where x=0.000001~0.06, y=0~1, and n=0~5.

According to another aspect of the present disclosure, a crystal is provided. A formula of the crystal may be $(A_{1-b}B_b)_3(P_{1-q}Q_q)_5O_{12}$, wherein A may consist of at least one of Gd, Lu, La, Yb, Sc, or Y, B may consist of at least one of Ce, Na, K, Cu, Ag, Mg, Ca, Zn, Sr, Gd, B, Al, Ga, V, Cr, Mn, Fe, Co, Ni, Ti, Ge, Zr, Sn, Hf, La, Pr, Nd, Sm, Eu, Tb, Dy, Ho, Er, Tm, Yb, Y, Pm, or Lu, P may consist of at least one of Al, Ga, In, or Sc, and Q may consist of Al, and b=0~1, q=0~1.

In some embodiments, A may consist of Gd, B may consist of Ce, P may consist of Ga. The formula of the crystal may be $(Gd_{1-b}Ce_b)_3(Ga_{1-q}Al_q)_5O_{12}$.

According to yet another aspect of the present disclosure, a method for growing a crystal is provided. A formula of the crystal may be

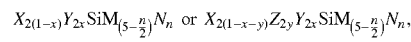

wherein X may consist of at least one of Gd, Lu, La, Yb, Sc, or Y, Y may consist of at least one of Ce, Na, K, Cu, Ag, Mg, Ca, Zn, Sr, Gd, B, Al, Ga, V, Cr, Mn, Fe, Co, Ni, Ti, Ge, Zr, Sn, Hf, La, Pr, Nd, Sm, Eu, Tb, Dy, Ho, Er, Tm, Yb, Y, Pm, or Lu, Z may consist of at least one of Sc, Y, Gd, or Lu, M may consist of at least one of O, Cl, F, Br, or S, and N may consist of at least one of C, F, Br, or S. The method may include the following operations. The method may include weighting reactants based on a molar ratio of the reactants according to a reaction equation for generating the crystal after a first preprocessing operation is performed on the reactants, wherein x=0.000001~0.06, y=0~1. The method may include placing reactants on which a second preprocessing operation has been performed into a crystal growth device after an assembly preprocessing operation may be performed on at least one component of the crystal growth device. The at least one component of the crystal growth device may include a crucible. The assembly processing operation may include at least one of a coating operation, an acid soaking and cleaning operation, or an impurity cleaning operation. The method may include introducing a flowing gas into the crystal growth device after sealing the crystal growth device. The method may further include activating the crystal growth device to grow the crystal based on the Czochralski technique.

In some embodiments, Y may at least consist of Ce. A reactant consisting of Ce may include at least one of $CeO_2$, $Ce_2O_3$, $Ce(CO_3)_2$, $CeCl_3$, cerium fluoride, cerium(III) sulfate, or cerium(III) bromide.

In some embodiments, a weight of a reactant consisting of Si may excess of 0.01%~10% of its weight.

According to yet another aspect of the present disclosure, a method for growing a crystal is provided. A formula of the crystal may be $(A_{1-b}B_b)_3(P_{1-q}Q_q)_5O_{12}$, wherein A may consist of at least one of Gd, Lu, La, Yb, Sc, or Y, B may consist of at least one of Ce, Na, K, Cu, Ag, Mg, Ca, Zn, Sr, Gd, B, Al, Ga, V, Cr, Mn, Fe, Co, Ni, Ti, Ge, Zr, Sn, Hf, La, Pr, Nd, Sm, Eu, Tb, Dy, Ho, Er, Tm, Yb, Y, Pm, or Lu, P may consist of at least one of Al, Ga, In, or Sc, and Q may consist of Al. The method may include the following operations. The method may include weighting reactants based on a molar ratio of the reactants according to a reaction equation for generating the crystal after a first preprocessing operation is performed on the reactants, wherein b=0~1, q=0~1. The method may include placing reactants on which a second preprocessing operation has been performed into a crystal growth device after an assembly preprocessing operation is performed on at least one component of the crystal growth device. The at least one component of the crystal growth device may include a crucible. The assembly processing operation may include at least one of a coating operation, an acid soaking and cleaning operation, or an impurity cleaning operation. The method may include introducing a flowing gas into the crystal growth device after sealing the crystal growth device. The method may further include activating the crystal growth device to grow the crystal based on the Czochralski technique.

In some embodiments, Y may at least consist of Ce. A reactant consisting of Ce may include at least one of $CeO_2$, $Ce_2O_3$, $Ce(CO_3)_2$, $CeCl_3$, cerium fluoride, cerium(III) sulfate, or cerium(III) bromide.

In some embodiments, B may include Ga. The weighting reactants may include a weight of the reactant consisting of Ga excessing of 0.01%~10% of its weight or a total weight of the reactants.

According to yet another aspect of the present disclosure, a method for growing a crystal is provided. The method may include the following operations. The method may include weighting reactants based on a molar ratio of the reactants according to a reaction equation for generating the crystal after a first preprocessing operation is performed on the reactants. The method may include placing reactants on which a second preprocessing operation has been performed into a crystal growth device after an assembly preprocessing operation is performed on at least one component of the crystal growth device. The at least one component of the crystal growth device may include a crucible. The assembly processing operation may include at least one of a coating operation, an acid soaking and cleaning operation, or an impurity cleaning operation. The method may include introducing a flowing gas into the crystal growth device after sealing the crystal growth device. The method may include activating the crystal growth device to grow the crystal based on the Czochralski technique.

The crystal may include GAGG, YAG, LSO, LYSO, GYSO, TGG, GGG, YVO4, GSO, sapphire, or a doped crystal thereof.

In some embodiments, the crystal may include cerium-doped LSO or cerium-doped LYSO. The weighting reactants based on the molar ratio of the reactants according to the reaction equation for generating the crystal after the first preprocessing operation is performed on the reactants may include weighting the reactants based on the molar ratio of the reactants according to a reaction equation (1) or a reaction equation (2) after the first preprocessing operation is performed on the reactants:

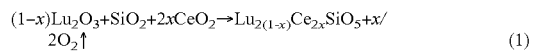

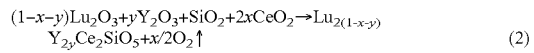

where x=0.0001%~6%, y=0~100%, and a weight of $SiO_2$ may excess of 0.01%~10% of its weight or a total weight of the reactants.

In some embodiments, a purity of each of the reactants may be greater than 99%, 99.9%, 99.99%, or 99.999%.

In some embodiments, the first preprocessing operation may include a roasting operation under 800° C.~1400° C. The second preprocessing operation may include at least one of an ingredient mixing operation or a pressing operation at room temperature.

In some embodiments, the flowing gas may include oxygen or a mixed gas of oxygen and one or more of nitrogen and inert gas. When the flowing gas is a mixed gas of oxygen and one or more of nitrogen and inert gas, a volume ratio of oxygen may be 0.001%~20% in an initial stage of the crystal growth.

In some embodiments, a flow rate of the flowing gas may be 0.01 L/min~50 L/min.

In some embodiments, a purity of the flowing gas may be greater than 99%, 99.9%, 99.99%, or 99.999%.

In some embodiments, a melting time of a heat treatment for melting the reactants may be 5~48 hours during the crystal growth.

In some embodiments, a distance between a seed crystal and an upper surface of the reactants may be 5~100 mm during melting the reactants during the crystal growth.

In some embodiments, the method may further include sinking the seed crystal to 0.1 mm~50 mm below a surface of a melt of the reactants by controlling a pulling rod during a temperature adjustment process.

In some embodiments, the method may further include maintaining a constant temperature at 1950° C.~2150° C. for at least 0.1 hours~1 hour after the temperature adjustment process.

In some embodiments, a rotation rate of a pulling rod may be 0.01 r/min~35 r/min during the crystal growth.

In some embodiments, a growth rate of the crystal may be 0.01 mm/h~6 mm/h during the crystal growth.

In some embodiments, a temperature decreasing time of the crystal during the crystal growth may be 20 hours~100 hours.

In some embodiments, during a shouldering process of the crystal growth, a shoulder angle may be 30 degrees~70 degrees. A shoulder length may be 40 mm~130 mm.

In some embodiments, during an ending process of the crystal growth, an ending angle may be 30 degrees~70 degrees, and an ending length may be 40 mm~110 mm.

In some embodiments, for the flowing gas including the mixed gas of oxygen and one or more of nitrogen or inert gas, during a cooling process of the crystal growth, the volume ratio of oxygen in the flowing gas may be 1%~30% when a temperature is within 1400° C.~800° C. The volume ratio of oxygen in the flowing gas may be 0.001%~20% when the temperature is lower than 800° C.

In some embodiments, for the flowing gas including the mixed gas of oxygen and one or more of nitrogen or inert gas, during a cooling process of the crystal growth, the volume ratio of oxygen in the flowing gas may be 5%~25% when a temperature is within 1400° C.~800° C., and the volume ratio of oxygen in the flowing gas is 0.001%~20% when the temperature is lower than 800° C.

In some embodiments, for the flowing gas including the mixed gas of oxygen and one or more of nitrogen or inert gas, during a cooling process of the crystal growth, the volume ratio of oxygen in the flowing gas may be 10%~20% when a temperature is within 1400° C.~800° C., and the volume ratio of oxygen in the flowing gas may be 0.001%~20% when the temperature is lower than 800'C.

In some embodiments, the crystal growth is controlled by a proportional-integral-derivative (PID) controller. A PID parameter may be 0.1~5.

According to yet another aspect of the present disclosure, a device for growing a crystal is provided. The device may include a temperature field device. The temperature field device may include a bottom plate, a cover plate, a drum, and a filler. The bottom plate may be mounted at a bottom of the temperature field device and cover an open end of the drum. The cover plate may be mounted at a top of the temperature field device and covers another open end of the drum. The filler may be filled in the drum.

According to yet another aspect of the present disclosure, a device for growing a crystal is provided. The device may include a temperature field device. The temperature field device may include a bottom plate, a cover plate, a first drum, a second drum, and a filler. The bottom plate may be mounted at a bottom of the temperature field device and cover an open end of the first drum. The cover plate may be mounted at a top of the temperature field device and cover another open end of the first drum. The second drum may be mounted within the first drum. The filler may be filled in the second drum, and/or a space formed between the first drum and the second drum.

In some embodiments, the filler filled in the second drum may be at least configured to support a crucible and cover at least a portion of the crucible. The reactants used for growing the crystal may be placed in the crucible to react.

In some embodiments, the temperature field device may further include a heater. The heater may be mounted above the crucible.

In some embodiments, the first drum may be made of heat resistant material.

In some embodiments, a shape of the filler may include at least one of a granular, a brick, or a felt. The filler may be made of the heat resistant material.

In some embodiments, a particle size of the filler may be 5~200 mesh.

In some embodiments, a dosage and a tightness of the filler may be adjusted according to a condition of the crystal growth.

In some embodiments, a filling height of the filler may result in that a vertical distance between an upper edge of the crucible supported by the filler and an upper edge of an induction coil mounted outside the temperature field device may be 0 mm~∓50 mm, wherein "−" represents that the upper edge of the crucible is lower than an upper edge of the induction coil, and "+" represents that the upper edge of the crucible is higher than the upper edge of the induction coil.

In some embodiments, the heater may be made of one or more of iridium, platinum, molybdenum, tungsten, graphite, or a material which has a high melting point and can be heated by electromagnetic induction. An inner diameter of the heater may be 40 mm~240 mm, and a height of the heater may be 2 mm~200 mm.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 1 is a flowchart illustrating an exemplary method for growing a crystal according to some embodiments of the present disclosure;

DETAILED DESCRIPTION

Figure 2:
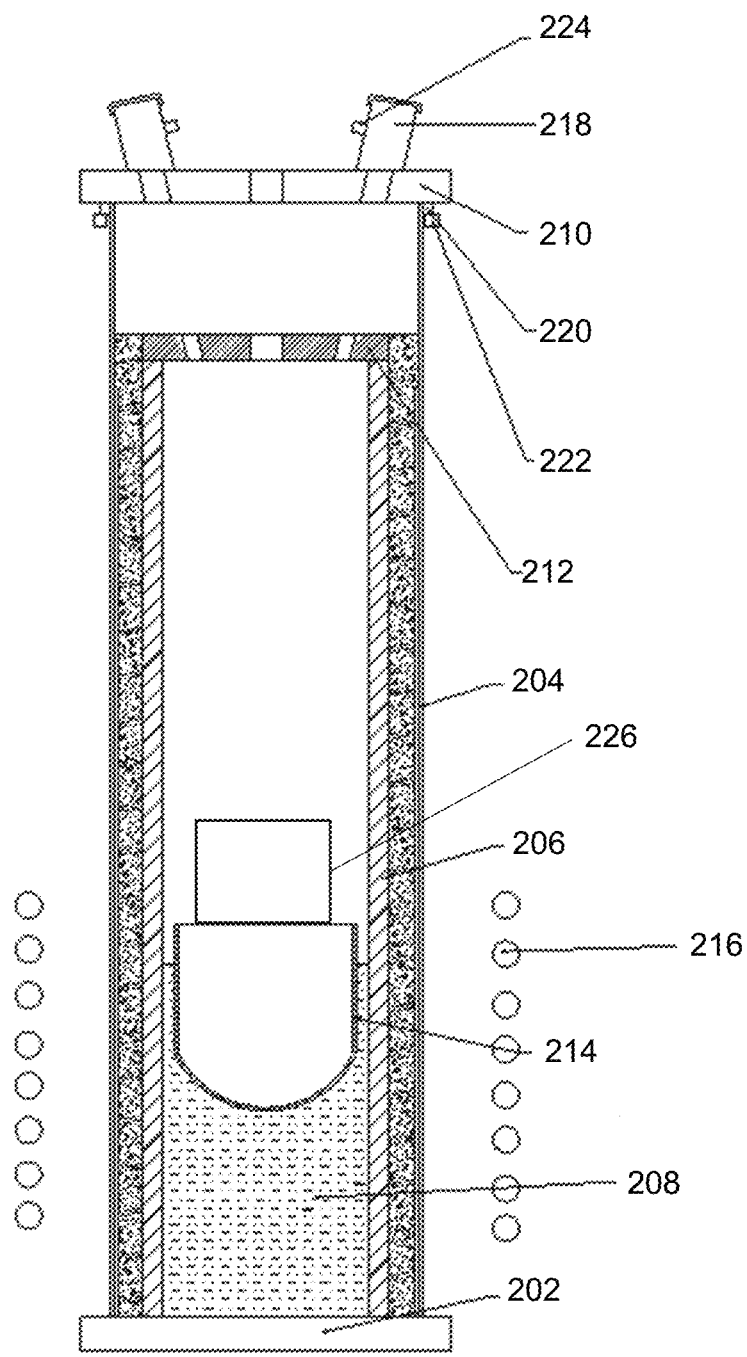
FIG. 2 is a schematic diagram illustrating an exemplary temperature field device according to some embodiments of the present disclosure.

In the following detailed description, numerous specific details with reference to the accompanying drawings are set forth by way of examples in order to provide a thorough understanding of the relevant disclosure. Various modifications to the disclosed embodiments will be readily apparent to those skilled in the art, and the general principles defined herein may be applied to other embodiments and applications without departing from the spirit and scope of the present disclosure. The identical numerals in the drawings represent same or similar structures or operation, unless the context clearly indicates otherwise.

It will be understood that the term "system," "device," "unit," and/or "module," used herein are one method to distinguish different components, elements, parts, section or assembly of different level in ascending order. However, the terms may be displaced by another expression if they achieve the same purpose.

The terminology used herein is for the purpose of describing particular example embodiments only and is not intended to be limiting. As used herein, the singular forms "a" "a," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

The range of values used herein in the present disclosure briefly illustrate each value in the range of values.

The flowcharts used in the present disclosure illustrate operations that systems implement according to some embodiments of the present disclosure. It should be noted that the foregoing or the following operations may not be performed in the order accurately. Instead, the steps can be processed in reverse order or simultaneously. Besides, one or more other operations may be added to the flow charts, or one or more operations may be omitted from the flow chart.

The present disclosure may disclose a crystal according to some embodiments of the present disclosure. In some embodiments, a formula of the crystal may be $$X_{2(1-x)}Y_{2x}SiM_{(5-\frac{n}{2})}N_n \text{ or } X_{2(1-x-y)}Z_{2y}Y_{2x}SiM_{(5-\frac{n}{2})}N_n,$$

wherein X may consist of at least one of Gd, Lu, La, Yb, Sc, or Y, Y may consist of at least one of Ce, Na, K, Cu, Ag, Mg, Ca, Zn, Sr, Gd, B, Al, Ga, V, Cr, Mn, Fe, Co, Ni, Ti, Ge, Zr, Sn, Hf, La, Pr, Nd, Sm, Eu, Tb, Dy, Ho, Er, Tm, Yb, Y, Pm, or Lu, Z may consist of at least one of Sc, Y, Gd, or Lu; M may consist of at least one of O, Cl, F, Br, or S, and N may consist of at least one of Cl, F, Br, or S. In some embodiments, X may consist of Lu, Y may consist of Ce, Z may consist of Y, and M may consist of O. The formula of the crystal may be $$Lu_{2(1-x)}Ce_{2x}SiO_{(5-\frac{n}{2})}N_n, \text{ or } Lu_{2(1-x-y)}Y_{2y}Ce_{2x}SiO_{(5-\frac{n}{2})}N_n.$$

In some embodiments, a value of x may be 0.000001~0.06. The value of x may be 0.00001~0.06. The value of x may be 0.0001~0.06. The value of x may be 0.001~0.06. The value of x may be 0.01~0.06. The value of x may be 0.02~0.05. The value of x may be 0.03~0.04. The value of x may be 0.032~0.038. The value of x may be 0.034~0.036. A value of y may be 0~1. The value of y may be 0.0001~1. The value of y may be 0.001~1, 0.01~1. The value of y may be 0.1~1. The value of y may be 0.2~0.9. The value of y may be 0.3~0.8. The value of y may be 0.4~0.7. The value of y may be 0.5~0.6. The value of y may be 0.52~0.58. The value of y may be 0.54~0.56. A value of n may be 0~5. The value of n may be 0.1~5. The value of n may be 0.5~4.5. The value of n may be 1~4. The value of n may be 1.5~3.5. The value of n may be 2~3. The value of n may be 2.2~2.8. The value of n may be 2.4~2.6. The value of n may be 2.45~2.55.

The present disclosure may disclose a crystal according to some embodiments of the present disclosure. In some embodiments, a formula of the crystal is $(A_{1-b}B_b)_3(P_{1-q}Q_q)_5O_{12}$, wherein A may consist of at least one of Gd, Lu, La, Yb, Sc, or Y, B may consist of at least one of Ce, Na, K, Cu, Ag, Mg, Ca, Zn, Sr, Gd, B, Al, Ga, V, Cr, Mn, Fe, Co, Ni, Ti, Ge, Zr, Sn, Hf, La, Pr, Nd, Sm, Eu, Tb, Dy, Ho, Er, Tm, Yb, Y, Pm, or Lu, P may consist of at least one of Al, Ga, In, or Sc, and Q may consist of Al. In some embodiments, A may consist of Gd, B may consist of Ce, P may consist of Ga, and the formula of the crystal may be represented as $(Gd_{1-b}Ce_b)_3(Ga_{1-q}Al_q)_5O_{12}$. In some embodiments, a value of b may be 0~1. The value of b may be 0.2~0.9. The value of b may be 0.3~0.8. The value of b may be 0.4~0.7. The value of b may be 0.5~0.6. The value of b may be 0.52~0.58. The value of b may be 0.54 0.56. A value of p may be 0~1. The value of p may be 0.2~0.9. The value of p may be 0.3~0.8. The value of p may be 0.4~0.7. The value of p may be 0.5~0.6. The value of p may be 0.52~0.58. The value of p may be 0.54~0.56.

In some embodiments, the crystal (e.g., the $$X_{2(1-x)}Y_{2x}SiM_{(5-\frac{n}{2})}N_n, \text{ the } X_{2(1-x-y)}Z_{2y}Y_{2x}SiM_{(5-\frac{n}{2})}N_n,$$

or the $(A_{1-b}B_b)_3(P_{1-q}Q_q)_5O_{12})$) may be prepared according to the following method.

In a first step, reactants may be weighted based on a molar ratio of the reactants according to a reaction equation for generating the crystal after a first preprocessing operation is performed on the reactants. In some embodiments, the crystal may be grown from a melt of a mixture of an oxide of X, an oxide of Y, and an oxide of Si. The reaction equation may include oxide reactants used for growing the crystal. In order to remove substances such as water and/or organic substance(s) of metal element(s) to improve the purity of the reactants, the first preprocessing operation may be performed on the reactants. For example, a roasting operation may be used to remove water and/or the organic substance(s). The roasting operation may be performed using a commercially available high-temperature roasting device such as a muffle furnace. In some embodiments, a roasting temperature of the reactants may be 800° C.~1400° C. Preferably, the roasting temperature of the reactants may be 900° C.~1300° C. More preferably, the roasting temperature of the reactants may be 1000° C.~1200° C. More preferably, the roasting temperature of the reactants may be 1050° C.~1150° C. More preferably, the roasting temperature of the reactants may be 1060° C.~1140° C. More preferably, the roasting temperature of the reactants may be 1070° C.~1130° C. More preferably, the roasting temperature of the reactants may be 1080° C.~1120° C. More preferably, the roasting temperature of the reactants may be 1090° C.~1110° C. According to characteristics of the different reactants, the time of the high-temperature roasting may be not less than 5 hours.

For crystals with different molecular formulas, different weighting manners may be used for weighting the reactants. In some embodiments, when weighing the reactant(s), a weight of a reactant containing Si may excess its weight or a total weight of reactants by 0.01%~10%. The weight of the reactant containing Si may excess its weight or a total weight of reactants by 0.1%~10%. The weight of the reactant containing Si may excess its weight or a total weight of reactants by 1%~10%. The weight of the reactant containing Si may excess its weight or a total weight of reactants by 2%~9%. The weight of the reactant containing Si may excess its weight or a total weight of reactants by 3%~8%. The weight of the reactant containing Si may excess its weight or a total weight of reactants by 4%~7%. The weight of the reactant containing Si may excess its weight or a total weight of reactants by 5%~6%.

In a second step, the reactants may be placed into a crystal growth device after a second preprocessing operation is performed on the reactants. In some embodiments, the second preprocessing operation may include at least one of an ingredient mixing operation or a pressing operation at room temperature. It can be understood that uniformly mixed reactants may be conducive to the subsequent growth of the crystal. Exemplary mixing device may include but is not limited to a three-dimensional motion mixer, a double cone mixer, a vacuum mixer, a coulter mixer, a V mixer, a conical twin-screw screw mixer, a planetary mixer, a horizontal screw mixer, etc. A mixing time of the reactants may be 0.5 hours~48 hours. Preferably, the mixing time may be 1 hour~48 hours. More preferably, the mixing time may be 6 hours~42 hours. More preferably, the mixing time may be 12 hours~36 hours. More preferably, the mixing time may be 18 hours~30 hours. More preferably, the mixing time may be 21 hours~27 hours.

The pressing operation may refer to an operation in which a certain pressure may be applied to the reactants to transform the reactants from a dispersed state into a body with an initial shape, for example, a cylindrical shape. The pressed reactants may have a volume smaller than that of the reactants in the dispersed state and may be easier to be put into a reaction device (e.g., a reaction crucible) in one time. Meanwhile, the pressing operation may discharge the air contained in the reactants in the dispersed state to reduce an impact of the air on the crystal growth in subsequent reactions. The pressing operation may be performed by an isostatic pressing device such as cold isostatic pressing device. The reactants may be placed in a pressing tank and pressed into the body with the initial shape. The pressure used during the pressing operation may be 100 MPa~300 MPa. Preferably, the pressure used during the pressing operation may be 150 MPa~250 MPa. More preferably, the pressure used during the pressing operation may be 160 MPa~240 MPa. More preferably, the pressure used during the pressing operation may be 170 MPa~230 MPa. More preferably, the pressure used during the pressing operation may be 180 MPa~220 MPa. More preferably, the pressure used during the pressing operation may be 190 MPa~210 MPa. More preferably, the pressure used during the pressing operation may be 200 MPa.

In some embodiments, the crystal growth device may include a single crystal growth furnace and a temperature field device. A type of the single crystal growth furnace may include an open type or a vacuum type, which is not limited in the present disclosure. The temperature field device may be used in the single crystal growth furnace to provide a temperature gradient for the crystal growth, and ensure the stability of a crystallization process of the crystal. A temperature field with good symmetry and stability may avoid problems of cracking and abnormal growth during the crystal growth. The temperature field device may include a first hollow column and two cover plates covering two ends of the first hollow column, respectively. Specifically, two cover plates may be connected to the two ends of the first hollow column. The connection may include a bonding connection, a welding connection, a riveting connection, a key connection, a bolt connection, a buckle connection, or the like, or any combination thereof. Alternatively, a first end of the two ends of the first hollow column may be connected to one cover plate of the two cover plates (e.g., via a detachable connection), a second end of the two ends may be integrally formed with the other cover plate, or connected to the other cover plate via a non-detachable connection. A second hollow column with a height less than that of the first hollow column may be mounted inside the first hollow column. A space between the first hollow column and the second hollow column and/or a space in the second hollow column may be filled with a substance used for heat preservation. For example, the space between the first hollow column and the second hollow column and the space in the second hollow column may be filled with the substance. As another example, the space between the first hollow column and the second hollow column may be filled with a substance used for heat preservation, and the space in the second hollow column may not be filled with the substance. As a further example, the space between the first hollow column and the second hollow column may not be filled with the substance, and the space in the second hollow column may be filled with the substance. The substance filled in the second hollow column may also be configured to support a crucible used for holding the reactants. In addition, an end of the second hollow column near the cover plate mounted on a top of the first hollow column may be connected with a heat preservation board to further improve the heat preservation effect. In this case, the temperature field device described in the present disclosure may provide a reaction environment with good heat preservation performance, stable temperature field gradient, and good symmetry due to the hollow columns and the substance used for heat preservation, which may be beneficial to the crystal growth. More descriptions regarding the temperature field device may be found elsewhere in the present disclosure (e.g., FIGS. 2-5), which are not repeated herein.

In a third step, a flowing gas may be introduced into the crystal growth device after the crystal growth device is sealed. In some embodiments, the sealing of the crystal growth device may refer to that except for necessary contact, there is no gas exchange between the crystal growth device and the atmospheric environment. For example, a hearth of an open single crystal growth furnace may be opened and an operator (e.g., a worker) may directly observe the temperature field device in the open single crystal growth furnace, whereas, the temperature field device should be sealed and have no gas exchange with the atmospheric environment. As another example, an interior of a vacuum single crystal growth furnace may be vacuum and the crystal growth device may have no gas exchange with the atmospheric environment. To realize the seal of the crystal growth device, a sealing ring, vacuum grease, and/or other sealing material may be mounted at joints among various components of the crystal growth device. It can be understood that a suitable protective gas may reduce volatilization of a reactant (e.g., silicon oxide) to a certain extent, thereby solving a problem of deviation of crystal components during the crystal growth. In some embodiments, the flowing gas may be introduced into the crystal growth device (e.g., the temperature field device) after the crystal growth device is sealed. The flowing gas may refer to a protective gas that enters from an inlet of the crystal growth device and flows out from an outlet of the crystal growth device. The flowing gas may include oxygen or a mixed gas of oxygen and one or more of nitrogen and inert gas. It should be noted that the inert gas described in the present disclosure may include nitrogen. In some embodiments, when the flowing gas is a mixed gas of oxygen and one or more of nitrogen and inert gas, a volume ratio of oxygen may be 0.001%~20%, 15%, 13%, 12%, 10% of the mixed gas in an initial stage of the crystal growth process, e.g., a stage before cooling the crystal. Preferably, the volume ratio of oxygen may be 0.01%~10%. More preferably, the volume ratio of oxygen may be 0.1%~10%. More preferably, the volume ratio of oxygen may be 1%~10%, 4%~15%, 5%~12%, 7%~12%, 8%~11%, 9%~11%, or 10%. More preferably, the volume ratio of oxygen may be 2%~9%. More preferably, the volume ratio of oxygen may be 3%~8%. More preferably, the volume ratio of oxygen may be 4%~7%. More preferably, the volume ratio of oxygen may be 5%~6%. To ensure that the flowing gas may not affect the reactants, for example, to bring in an impurity, purity of the flowing gas may be greater than 99%. Preferably, the purity of the flowing gas may be greater than 99.9%. More preferably, the purity of the flowing gas may be greater than 99.99%. More preferably, the purity of the flowing gas may be greater than 99.999%. When introducing the flowing gas to the crystal growth device, a flow rate of the flowing gas may be 0.01 L/min~50 L/min. Preferably, the flow rate of the flowing gas may be 0.1 L/min~50 L/min. More preferably, the flow rate of the flowing gas may be 1 L/min~50 L/min. More preferably, the flow rate of the flowing gas may be 5 L/min~45 L/min. More preferably, the flow rate of the flowing gas may be 10 L/min~40 L/min. More preferably, the flow rate of the flowing gas may be 15 L/min~35 L/min. More preferably, the flow rate of the flowing gas may be 20 L/min~30 L/min. More preferably, the flow rate of the flowing gas may be 21 L/min~29 L/min. More preferably, the flow rate of the flowing gas may be 22 L/min~28 L/min. More preferably, the flow rate of the flowing gas may be 23 L/min~27 L/min. More preferably, the flow rate of flowing gas may be 24 L/min~26 L/min.

In a fourth step, the crystal growth device may be activated and the crystal growth may be executed based on the Czochralski technique. In some embodiments, the activating of the crystal growth device may include energizing and/or activating a cooling component. The reactants may be used for the crystal growth after being melted by heating. After being energized, a medium frequency induction coil mounted in the single crystal growth furnace may heat the crucible to melt the reactants in the crucible, meanwhile, since a high temperature (e.g., 1900° C.) is required during the crystal growth, a plenty of heat radiation may be generated to the external environment. Further, since the crystal growth time (e.g., four days to forty days) is relatively long, the heat radiation may affect the performance of the crystal growth device. Accordingly, the cooling component may be used to reduce the heat radiation. A cooling manner of the cooling component may include a liquid cooling mode, an air cooling mode, or the like, or any combination thereof. For the liquid cooling mode, a cooling liquid may include water, ethanol, ethylene glycol, isopropanol, n-hexane, or the like, or any combination thereof. For example, the cooling liquid may include a 50:50 mixture of water and ethanol.

The Czochralski technique disclosed in the present disclosure may include a melting process, a seed crystal preheating process, a seeding process, a temperature adjustment process, a necking process, a shouldering process, an constant diameter growth process, an ending process, a cooling process, a crystal removing process, etc. The melting process may refer to a process during which the temperature may be increased to a certain value via a temperature increasing process, the reactants may be melted to form a melt, and a certain temperature (i.e., temperature gradient) can be kept in the crystal growth device. The crucible in the crystal growth device may be used as a heater and heat may be radiated from the crucible to the surroundings to form the temperature gradient in the crystal growth device. The temperature gradient may refer to a change rate of the temperature at a certain point toward a temperature of an adjacent point in the crystal growth device, which may also be referred to as a change rate of the temperature per unit distance. Merely by way of example, a temperature change from a point M to a point N is (T1−T2), and a distance between the two points is (r1−r2), and the temperature gradient from the point M to the point N may be represented as $\Delta T=(T1-T2)/(r1-r2)$. During the crystal growth, a suitable temperature gradient is needed. For example, during the crystal growth, a large enough temperature gradient $\Delta T$ along a vertical direction is need, which can disperse the latent heat of crystallization generated during the crystal growth, thereby keep the crystal growth stable. Meanwhile, a temperature of the melt below a growth interface should be higher than a crystallization temperature, so that the local growth of crystal would not be too fast and the growth interface would be stable, thereby keeping the growth stable. The temperature gradient may be determined based on a location of a heating center. In some embodiments, during the melting process, the reactants may be melted and then solidified to form a polycrystalline material, when a diameter of the polycrystalline material reaches 50 mm, the temperature increasing operation may be stopped. An upper limit of the temperature increasing operation may be determined according to a temperature or a heating power (e.g., a power of the induction coil) at a time when a screw rod started to be pulled up when the crystal growth device was used at the last time. For example, the heating power may be less than the heating power at the time when the pulling rod started to be pulled up at the last time by 300~500 watts. A temperature increasing rate may be determined based on the temperature at which the pulling started to be pulled up at the last time. For example, the temperature increasing rate may be a ratio the temperature and the time (e.g., 24 hours). After temperature increasing operation is completed, the temperature may be maintained for 0.5 hours-1 hour. According to a melting condition of the reactants, the temperature may be continually increased or decreased.

The seed crystal preheating process may refer to a process in which the seed crystal may be fixed on a top of the pulling rod and slowly dropped into the temperature field during the melting process, which can make a temperature of the seed crystal close to that of the melt, thereby avoiding cracking of the seed crystal when a supercooled seed crystal contacts with the melt in subsequent operations. During the seed crystal preheating process, a distance between the seed crystal and an upper surface of the reactants may be controlled. Preferably, the distance between the seed crystal and the upper surface of the reactants may be 5 mm~100 mm. Preferably, the distance between the seed crystal and the upper surface of the reactants may be 5 mm~90 mm. More preferably, the distance between the seed crystal and the upper surface of the reactants may be 5 mm~80 mm. More preferably, the distance between the seed crystal and the upper surface of the reactants may be 5 mm~70 mm. More preferably, the distance between the seed crystal and the upper surface of the reactants may be 5 mm~60 mm. More preferably, the distance between the seed crystal and the upper surface of the reactants may be 5 mm~50 mm. More preferably, the distance between the seed crystal and the upper surface of the reactants may be 5 mm~40 mm. More preferably, the distance between the seed crystal and the upper surface of the reactants may be 5 mm~30 mm. More preferably, the distance between the seed crystal and the upper surface of the reactants may be 5 mm~20 mm. More preferably, the distance between the seed crystal and the upper surface of the reactants may be 5 mm~15 mm. More preferably, the distance between the seed crystal and the upper surface of the reactants may be 6 mm~14 mm. More preferably, the distance between the seed crystal and the upper surface of the reactants may be 7 mm~13 mm. More preferably, the distance between the seed crystal and the upper surface of the reactants may be 8 mm~12 mm. More preferably, the distance between the seed crystal and the upper surface of the reactants may be 9 mm~11 mm. In some embodiments, a dimeter of the seed crystal may be 6 mm~10 mm. Preferably, the dimeter of the seed crystal may be 7 mm~9 mm.

The seeding process may refer to a process in which the pulling rod may be dropped to cause the seed crystal to contact with the melt after the reactants are melted to form a melt. The temperature adjustment process may refer to a process in which a temperature in the crystal growth device may be adjusted to a suitable temperature for the crystal growth. During the temperature adjustment process, the seed crystal may be sunk by 0.1 mm~50 mm. Preferably, the seed crystal may be sunk by 1 mm~50 mm. More preferably, the seed crystal may be sunk by 10 mm~40 mm. More preferably, the seed crystal may be sunk gain by 20 mm~30 mm. More preferably, the seed crystal may be sunk by 21 mm~29 mm. More preferably, the seed crystal may be sunk by 22 mm~28 mm. More preferably, the seed crystal may be sunk by 23 mm~27 mm. More preferably, the seed crystal may be sunk by 24 mm~26 mm. In some embodiments, a rate of the temperature adjustment may be 100~300 watts/0.1 hour. After the temperature adjustment process is completed, the temperature inside the crystal growth device may be kept at 1950° C.~2150° C. for 0.1 hours~1 hour. Then, the screw rod may be rotated to pull the pulling rod up. After the seed crystal passed through a second cover plate and during the subsequent crystal growth process, a rotation rate of the pulling rod may be 0.01 rpm~35 rpm. More preferably, the rotation rate of the pulling rod may be 0.1 rpm/min~35 rpm/min. More preferably, the rotation rate of the pulling rod may be 1 rpm/min~35 rpm/min. More preferably, the rotation rate of the pulling rod may be 5 rpm/min~30 rpm/min. More preferably, the rotation rate of the pulling rod may be 10 rpm/min~25 rpm/min. More preferably, the rotation rate of the pulling rod may be 15 rpm/min~20 rpm/min.

The necking process may refer to a process in which the temperature may be slowly increased to cause a temperature of a zero point of the melt (i.e., a temperature of a center point of the liquid surface in crucible) to be slightly higher than the melting point of the crystal, a diameter of a newly grown crystal during the rotation and pulling up of the seed crystal may be gradually decreased. The necking process may reduce the extension of crystal dislocations from the seed crystal to a single crystal below a neck. The shouldering processing may refer to a process in which when atoms or molecules on a solid-liquid interface at a boundary between the seed crystal and the melt begin to be arranged in a structure of the seed crystal, the temperature in the temperature field may be slowly decreased according to a real-time growth rate of the crystal to expand the seed crystal according to a preset angle. In some embodiments, the shoulder angle may be 30 degrees~70 degrees. More preferably, the shoulder angle may be 40 degrees~60 degrees. More preferably, the shoulder angle may be 45 degrees~55 degrees. More preferably, the shoulder angle may be 46 degrees~54 degrees. More preferably, the shoulder angle may be 47 degrees~53 degrees. More preferably, the shoulder angle may be 48 degrees~52 degrees. More preferably, the shoulder angle may be 49 degrees~51 degrees. A shoulder length may be 40 mm~130 mm. Preferably, the shoulder length may be 50 mm~120 mm. More preferably, the shoulder length may be 60 mm~110 mm. More preferably, the shoulder length may be 70 mm~100 mm. More preferably, the shoulder length may be 80 mm-90 mm.

The constant diameter growth process may refer to a process in which a rod-like structure with a diameter determined during the shouldering process may be obtained. In some embodiments, a diameter of the crystal growth may be 10 mm~200 mm. Preferably, the diameter of the crystal growth may be 20 mm~180 mm. More preferably, the diameter of the crystal growth may be 50 mm~150 mm. More preferably, the diameter of the crystal growth may be 60 mm~140 mm. More preferably, the diameter of the crystal growth may be 70 mm~130 mm. More preferably, the diameter of the crystal growth may be 80 mm~120 mm. More preferably, the diameter of the crystal growth may be 90 mm~110 mm.

The ending process may refer to a process in which the crystal may be raised up to be separated from the melt when the crystal grows to a predetermined length. The ending process may be a reverse operation of the shouldering process. The diameter of the crystal may be reduced until the crystal is separated from the melt by changing a pulling speed of the pulling rod, or the diameter of the crystal may be reduced to a preset diameter such as 10 mm. An automatic control program may be used to calculate a change of the diameter of the crystal based on a predetermined parameter of the ending process, and perform the ending process according to a preset angle by increasing or decreasing the temperature. In some embodiments, an ending angle may be 30 degrees~70 degrees. Preferably, the ending angle may be 40 degrees~60 degrees. More preferably, the ending angle may be 45 degrees~55 degrees. More preferably, the ending angle may be 46 degrees~54 degrees. More preferably, the ending angle may be 47 degrees~53 degrees. More preferably, the ending angle may be 48 degrees~52 degrees. More preferably, the ending angle may be 49 degrees~51 degrees. An ending length of the crystal may be 40 mm~110 mm. More preferably, the ending length of the crystal may be 50 mm~100 mm. More preferably, the ending length of the crystal may be 60 mm~90 mm. More preferably, the ending length of the crystal may be 70 mm~80 mm.

The cooling process may refer to a process in which a temperature may be slowly decreased after the ending process is completed, to eliminate a stress within the crystal, which may be formed in the high-temperature crystal growth. The cooling process may prevent cracking of the crystal caused by a sudden drop of the temperature. In some embodiments, for the flowing gas including a mixed gas of oxygen and one or more of nitrogen or an inert gas, during the cooling process, when the temperature drops to 1400° C.~800° C., the volume ratio of oxygen in the flowing gas may be increased to cause the oxygen to effectively diffuse into the crystal. In some embodiments, during increasing the volume ratio of oxygen, a cooling rate of the crystal may also be slowed, or a stepwise cooling process may be performed to cause the oxygen to diffuse more fully. In some embodiments, when the temperature drops to 1400° C.~800° C., the volume of oxygen in the flowing gas may be increased to 1%~30% during the cooling process. More preferably, when the temperature drops to 1400° C.~800° C., the volume ratio of oxygen in the flowing gas may be increased to 2%~28%. More preferably, when the temperature drops to be 1400° C.~800° C., the volume ratio of oxygen in the flowing gas may be increased to 5%~25%. More preferably, when the temperature drops to be 1400° C.~800° C., the volume ratio of oxygen in the flowing gas may be increased to 10%~20%. More preferably, when the temperature drops to be 1400° C.~800° C., the volume ratio of oxygen in the flowing gas may be increased to 13%~17%. More preferably, when the temperature drops to be 1400° C.~800° C., the volume ratio of oxygen in the flowing gas may be increased to 14%~16%. When the temperature is lower than 800° C., the volume ratio of oxygen in the flowing gas may be at least decreased to a volume ratio of oxygen in a previous crystal growth process, which may be 0.001%~20% and other mentioned temperature. In some embodiments, a cooling time of the crystal may be 20 hours~100 hours. More preferably, the cooling time of crystal may be 30 hours~90 hours. More preferably, the cooling time of the crystal may be 40 hours~80 hours. More preferably, the cooling time of the crystal may be 50 hours~70 hours. More preferably, the cooling time of the crystal may be 55 hours~65 hours. In some embodiments, assuming that T is the temperature after the ending process, a decreasing rate of a crystal temperature during the cooling process may be T/(20-100) hours. In some embodiments, the decreasing rate of the crystal temperature may be 15°

C./h~95° C./h. More preferably, the decreasing rate of the crystal temperature may be 20° C./h~65° C./h. More preferably, the decreasing rate of the crystal temperature may be 23° C./h~47° C./h. More preferably, the decreasing rate of the crystal temperature may be 26° C./h~38° C./h. More preferably, the decreasing rate of the crystal temperature may be 28° C./h~34° C./h. When an output heating power (e.g., the heating power of the induction coil) is 0, the crystal growth may end.

The crystal removing process may refer to a process in which the grown crystal may be taken out from the crystal growth device when an internal temperature of the crystal growth device drops to the room temperature. In the crystal growth process, according to a setting of various process parameters in different stages of the crystal growth process, the growth rate of the crystal may be 0.01 mm/h~6 mm/h. Preferably, the growth rate of the crystal may be 0.1 mm/h~6 mm/h. More preferably, the growth rate of the crystal may be 1 mm/h~6 mm/h. More preferably, the growth rate of the crystal may be 2 mm/h~5 mm/h. More preferably, the growth rate of the crystal may be 3 mm/h~4 mm/h. A diameter of an obtained crystal may be 50 mm~115 mm. A diameter of a grown crystal may be equal to or greater than 60 mm, such as 60 mm~105 mm (e.g., 60 mm), 70 mm~90 mm (e.g., 80 mm). The constant diameter may be reached to more than 130 mm, such as 130 mm~200 mm, 150 mm~180 mm, or 160 mm~170 mm.

In some embodiments, one or more processes in the crystal growth may be controlled by a PID controller. The one or more process may include but are not limited to the necking process, the shouldering process, the constant diameter growth process, the ending process, the cooling process, etc. In some embodiments, the PID parameter may be 0.1~5. preferably, the PID parameter may be 0.5~4.5. More preferably, the PID parameter may be 1~4. More preferably, the PID parameter may be 1.5~3.5. More preferably, the PID parameter may be 2~3. More preferably, the PID parameter may be 2.5~3.5.

It should be noted that the embodiments mentioned above regarding the crystal growth are only for explaining the technical solutions of the present disclosure and not limiting the technical solutions. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

FIG. 1 is a flowchart illustrating an exemplary method for growing a crystal according to some embodiments of the present disclosure. In some embodiments, the method shown in process 100 may be implemented based on the Czochralski technique.

In step 110, reactants may be weighted based on a molar ratio of the reactants according to a reaction equation for generating the oxide crystal after a first preprocessing operation is performed on the reactants. The oxide crystal may include gadolinium aluminum gallium garnet (GAGG), yttrium aluminum garnet (YAG), lutetium orthosilicate (LSO), lutetium yttrium orthosilicate (LYSO), gadolinium yttrium oxyorthosilicate (GYSO), terbium gallium garnet (TGG), gadolinium gallium garnet (GGG), yttrium orthovanadate (YVO4), gadolinium orthosilicate (GSO) sapphire, or a doping crystal thereof. Take a process for growing cerium-doped LSO crystal or cerium-doped LYSO crystal as an example, the reaction equation may be denoted by Equations below:

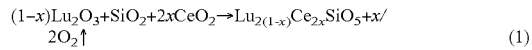
(1)

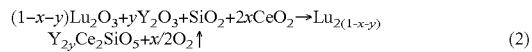
(2)

As shown in equation (2), in the Ce:LSO crystal, $Ce^{3+}$ displaces lutetium (Lu) atoms to form a structure of the crystal. In the above equations, x represents a doping concentration of trivalent cerium ion ($Ce^{3+}$), that is, a proportion of $Ce^{3+}$ occupying atomic lattice of Lutetium, and y represents a proportion of yttrium (Y) atoms in crystal lattice of the Ce:LSO. In some embodiments, a value of x may be 0.0001%~6%. Preferably, the value of x may be 0.001%~5%. More preferably, the value of x may be 0.01%~4%. More preferably, the value of x may be 0.1%~3%. More preferably, the value of x may be 0.11%~2%. More preferably, the value of x may be 0.12%~1%. More preferably, the value of x may be 1.13%~0.5%. More preferably, the value of x may be 0.14%~0.25%. More preferably, the value of x may be 0.15%~0.17%. More preferably, the value of x may be 0.16%. A value of y may be 0~100%. Preferably, the value of y may be 0.01%~90%. Preferably, the value of y may be 0.1%~80%. More preferably, the value of y may be 10%~70%. More preferably, the value of y may be 20%~60%. More preferably, the value of y may be 30%~50%. More preferably, the value of y may be 32%~48%. More preferably, the value of y may be 34%~46%. More preferably, the value of y may be 36%~44%. More preferably, the value of y may be 38%~42%. More preferably, the value of y may be 40%. It should be noted that a value of x for growing the Ce:LSO crystal may be similar to the value of x for growing the Ce:LSO as above described. For example, the value of x for growing the Ce:LSO crystal may be 0.0001%~6%, or any other listed preferred value.

It can be understood that during the growth of the crystal, silicon dioxide ($SiO_2$) may volatilize under a heating condition, which may cause composition deviation of the generated crystal, composition difference among crystals generated in different times, and a poor growth repeatability. According to some embodiments of the present disclosure, an excessive amount of silicon dioxide may be used to avoid composition deviation and poor growth repeatability caused by the volatilization of the silicon dioxide to a certain extent. In some embodiments, a weight of the silicon dioxide may excess of 0.01%~10% of its weight or the total weight of the reactants as determined according to the reaction equation. Preferably, the weight of the silicon dioxide may excess of 0.1%~10% of its weight or the total weight of the reactants. More preferably, the weight of the silicon dioxide may excess of 0.11%~10% of its weight or the total weight of the reactants. More preferably, the weight of the silicon dioxide may excess of 0.12%~9% of its weight or the total weight of the reactants. More preferably, the weight of the silicon dioxide may excess of 0.13%~8% of its weight or the total weight of the reactants. More preferably, the weight of the silicon dioxide may excess of 0.14%~7% of its weight or the total weight of the reactants. More preferably, the weight of the silicon dioxide may excess of 0.15%~6% of its weight or the total weight of the reactants. More preferably, the weight of the silicon dioxide may excess of 0.16%~5% of its weight or the total weight of the reactants. More preferably, the weight of the silicon dioxide may excess of 0.17%~4% of its weight or the total weight of the reactants. More preferably, the weight of the silicon dioxide may excess of 0.18%~3% of its weight or the total weight of the reactants. More preferably, the weight of the silicon dioxide may excess of 0.2%~2% of its weight or the total weight of the reactants. In some embodiments, when x=0.16%, the weight of the silicon dioxide may excess of 0.2% of its weight or the total weight of the reactants, or when x=0.16%, y=20%, the weight of the silicon dioxide may excess of 0.2% of its weight or the total weight of the reactants.

Purity of the reactants may have a great influence on the scintillation performance of the crystal. In order to generate the crystal meeting requirements, the purity of the reactants for growing the crystal may be greater than 99%. Preferably, the purity of the reactants may be greater than 99.9%. More preferably, the purity of the reactants may be greater than 99.99%. More preferably, the purity of the reactants may be greater than 99.999%.

In some embodiments, the first preprocessing operation may include a high temperature roasting operation. It can be understood that the high temperature roasting operation may be performed on all or a portion of the reactants to remove substances such as water and/or organic substance(s) of metal element(s) (e.g., cerium, Ga, aluminum, gadolinium, etc.) to improve the purity of the reactants. For example, a roasting operation may be performed to remove water and/or the organic substance(s). The roasting operation may be performed using a commercially available high-temperature roasting device such as a muffle furnace. In some embodiments, a roasting temperature of the reactants may be 800° C.~1400° C. Preferably, the roasting temperature of the reactants may be 900° C.~1300° C. More preferably, the roasting temperature of the reactants may be 1000° C.~1200° C. More preferably, the roasting temperature of the reactants may be 1050° C.~1150° C. More preferably, the roasting temperature of the reactants may be 1060° C.~1140° C. More preferably, the roasting temperature of the reactants may be 1070° C.~1130° C. More preferably, the roasting temperature of the reactants may be 1080° C.~1120° C. More preferably, the roasting temperature of the reactants may be 1090° C.~1110° C. According to the characteristics of the different reactants, the time of the high-temperature roasting may be not less than 5 hours.

In step 120, the reactants may be placed on which a second preprocessing operation has been performed into a crystal growth device after an assembly preprocessing operation is performed on at least one component of the crystal growth device. In some embodiments, the at least one component of the crystal growth device may include a crucible. In some embodiments, the assembly processing operation may include at least one of a coating operation, an acid soaking and cleaning operation, or an impurity cleaning operation on the crucible. The crucible may be made of iridium (Ir), molybdenum (Mo), tungsten (W), rhenium (Re), graphite (C), tungsten-molybdenum alloy, or the like, or any combination thereof. The coating operation may refer to adding a high-temperature coating material (e.g., polyamide silicone) to an outer surface of the crucible. The coating operation may isolate or reduce a contact between oxygen and the crucible, thereby avoiding or reducing oxidation of the crucible and the effect of its oxide on the crystal in an oxygen-rich environment for growing the crystal. In some embodiments, after the coating operation, the acid cleaning operation may be performed on the crucible. For example, an inner wall of the crucible may be soaked with an acid. In some embodiments, the acid may include an organic acid, an inorganic acid, or the like, or any combination thereof. Exemplary organic acid may include carboxylic acid (e.g., formic acid, acetic acid, oxalic acid, etc.), sulfonic acid (e.g., ethanesulfonic acid, benzenesulfonic acid, etc.), sulfinic acid, or the like, or any combination thereof. Exemplary inorganic acid may include hydrochloric acid, sulfuric acid, nitric acid, phosphoric acid, or the like, or any combination thereof. In some embodiments, a concentration of the acid may be 1%~15%. Preferably, the concentration of the acid may be 3%~13%. More preferably, the concentration of the acid may be 5%~11%. More preferably, the concentration of the acid may be 6%~10%. More preferably, the concentration of the acid may be 7%~9%. More preferably, the concentration of the acid may be 7.5%~8.5%. A soaking time of the acid may be 0.1 hours~10 hours. Preferably, the soaking time of the acid may be 0.5 hours~7 hours. More preferably, the soaking time of the acid may be 0.6 hours~5 hours. More preferably, the soaking time of the acid may be 0.8 hours~4 hours. More preferably, the soaking time of the acid may be 1 hours~3 hours. More preferably, the soaking time of the acid may be 1.5 hours~2.5 hours. After the soaking, the crucible may be cleaned with pure water and dried. The impurity cleaning may refer to remove the impurity in the crucible. The crucible may be wiped with medical alcohol. After the processing operation, the crucible may be mounted.

In some embodiments, the second preprocessing operation may include at least one of an ingredient mixing operation or a pressing operation at room temperature. It can be understood that uniformly mixed reactants may be conducive to the subsequent growth of the crystal. Exemplary mixing device may include but is not limited to a three-dimensional motion mixer, a double cone mixer, a vacuum mixer, a coulter mixer, a V mixer, a conical twin-screw screw mixer, a planetary mixer, a horizontal screw mixer, etc. A mixing time of the reactants may be 0.5 hours~48 hours. Preferably, the mixing time of the reactants may be 1 hours~48 hours. More preferably, the mixing time of the reactants may be 6 hours~42 hours. More preferably, the mixing time of the reactants may be 12 hours~36 hours. More preferably, the mixing time of the reactants may be 18 hours~30 hours. More preferably, the mixing time of the reactants may be 21 hours~27 hours.

The pressing operation may refer to an operation in which a certain pressure may be applied to the reactants to transform the reactants from a dispersed state into a body with an initial shape, for example, a cylindrical shape. The pressed reactants may have a volume smaller than that of the reactants in the dispersed state, and is easier to be put into a reaction device (e.g., a reaction crucible) in one time. Meanwhile, the pressing operation may discharge the air contained in the reactants in the dispersed state to reduce an impact of the air on the crystal growth in subsequent reactions. The pressing operation may be performed by an isostatic pressing device such as a cold isostatic pressing device. The reactants may be placed in a pressing tank and pressed into the body with the initial shape. The pressure used during the pressing operation may be 100 MPa~300 MPa. Preferably, the pressure used during the pressing operation may be 150 MPa~250 MPa. More preferably, the pressure used during the pressing operation may be 160 MPa~240 MPa. More preferably, the pressure used during the pressing operation may be 170 MPa~230 MPa. More preferably, the pressure used during the pressing operation may be 180 MPa~220 MPa. More preferably, the pressure used during the pressing operation may be 190 MPa~210 MPa. More preferably, the pressure used during the pressing operation may be 200 MPa.

In some embodiments, the crystal growth device may include a single crystal growth furnace and a temperature field device. A type of the single crystal growth furnace may include an open type or a vacuum type, which is not limited in the present disclosure. The temperature field device may be used in the single crystal growth furnace to provide a temperature gradient for the crystal growth, and ensure the stability of a crystallization process of the crystal. A temperature field with good symmetry and stability may avoid problems of cracking and abnormal growth during the crystal growth. The temperature field device may include a first hollow column and two cover plates covering two ends of the first hollow column, respectively. Specifically, two cover plates may be connected to the two ends of the first hollow column. The connection may include a bonding connection, a welding connection, a riveting connection, a key connection, a bolt connection, a buckle connection, or the like, or any combination thereof. Alternatively, a first end of the two ends of the first hollow column may be connected to one cover plate of the two cover plates (e.g., via a detachable connection), a second end of the two ends may be integrally formed with the other cover plate, or connected to the other cover plate via a non-detachable connection. A second hollow column with a height less than that of the first hollow column may be mounted inside the first hollow column. A space between the first hollow column and the second hollow column and/or a space in the second hollow column may be filled with a substance used for heat preservation. For example, the space between the first hollow column and the second hollow column and the space in the second hollow column may be filled with the substance. As another example, the space between the first hollow column and the second hollow column may be filled with a substance used for heat preservation, and the space in the second hollow column may not be filled with the substance. As a further example, the space between the first hollow column and the second hollow column may not be filled with the substance, and the space in the second hollow column may be filled with the substance. The substance filled in the second hollow column may also be configured to support a crucible used for holding the reactants. In addition, an end of the second hollow column near the cover plate mounted on a top of the first hollow column may be connected with a heat preservation board to further improve the heat preservation effect. In this case, the temperature field device described in the present disclosure may provide a reaction environment with good heat preservation performance, stable temperature field gradient, and good symmetry due to the hollow columns and the substance used for heat preservation, which may be beneficial to the crystal growth. More descriptions regarding the temperature field device may be found elsewhere in the present disclosure (e.g., FIGS. 2-5), which are not repeated herein.

In step 130, a flowing gas may be introduced into the crystal growth device after the crystal growth device is sealed. In some embodiments, the sealing of the crystal growth device may refer to that except for necessary contact, there is no gas exchange between the crystal growth device and the atmospheric environment. For example, a hearth of an open single crystal growth furnace may be opened and an operator (e.g., a worker) may directly observe the temperature field device in the open single crystal growth furnace, whereas, the temperature field device should be sealed and have no gas exchange with the atmospheric environment. As another example, an interior of a vacuum single crystal growth furnace may be vacuum, and the crystal growth device may have no gas exchange with the atmospheric environment. To realize the seal of the crystal growth device, a sealing ring, vacuum grease, and/or other sealing material may be mounted at joints among various components of the crystal growth device. It can be understood that a suitable protective gas may reduce volatilization of a reactant (e.g., silicon oxide) to a certain extent, thereby solving a problem of deviation of crystal components during the crystal growth. In some embodiments, the flowing gas may be introduced into the crystal growth device (e.g., the temperature field device) after the crystal growth device is sealed. The flowing gas may refer to a protective gas that enters from an inlet of the crystal growth device and flows out from an outlet of the crystal growth device. The flowing gas may include oxygen or a mixed gas of oxygen and one or more of nitrogen and inert gas. It should be noted that the inert gas described in the present disclosure may include nitrogen. In some embodiments, when the flowing gas is a mixed gas of oxygen and one or more of nitrogen and inert gas, a volume ratio of oxygen may be 0.001%~20%, 15%, 13%, 12%, 10% of the mixed gas in an initial stage of the crystal growth process, e.g., a stage before cooling the crystal. Preferably, the volume ratio of oxygen may be 0.01%~10%. More preferably, the volume ratio of oxygen may be 0.1%~10%. More preferably, the volume ratio of oxygen may be 1%~10%, 4%~15%, 5%~12%, 7%~12%, 8%~11%, 9%~11%, or 10%. More preferably, the volume ratio of oxygen may be 2%~9%. More preferably, the volume ratio of oxygen may be 3%~8%. More preferably, the volume ratio of oxygen may be 4%~7%. More preferably, the volume ratio of oxygen may be 5%~6%. To ensure that the flowing gas may not affect the reactants, for example, to bring in an impurity, purity of the flowing gas may be greater than 99%. Preferably, the purity of the flowing gas may be greater than 99.9%. More preferably, the purity of the flowing gas may be greater than 99.99%. More preferably, the purity of the flowing gas may be greater than 99.999%. When introducing the flowing gas to the crystal growth device, a flow rate of the flowing gas may be 0.01 L/min~50 L/min. Preferably, the flow rate of the flowing gas may be 0.1 L/min~50 L/min. More preferably, the flow rate of the flowing gas may be 1 L/min~50 L/min. More preferably, the flow rate of the flowing gas may be 5 L/min~45 L/min. More preferably, the flow rate of the flowing gas may be 10 L/min~40 L/min. More preferably, the flow rate of the flowing gas may be 15 L/min~35 L/min. More preferably, the flow rate of the flowing gas may be 20 L/min~30 L/min. More preferably, the flow rate of the flowing gas may be 21 L/min~29 L/min. More preferably, the flow rate of the flowing gas may be 22 L/min~28 L/min. More preferably, the flow rate of the flowing gas may be 23 L/min~27 L/min. More preferably, the flow rate of flowing gas may be 24 L/min~26 L/min.

In step 140, the crystal growth device may be activated and the crystal growth may be executed based on the Czochralski technique. In some embodiments, the activating of the crystal growth device may include energizing and/or introducing a cooling liquid (e.g., water). The reactants may be used for the crystal growth after being melted by heating. After being energized, a medium frequency induction coil mounted in the single crystal growth furnace may heat the crucible to melt the reactants in the crucible. In some embodiments, a melting time of the reactants may be 5 hours~48 hours by heating the reactants during a crystal growth process. Preferably, the melting time of the reactants may be 10 hours~40 hours or 30 hours. More preferably, the melting time of the reactants may be 15 hours~35 hours. More preferably, the melting time of the reactants may be 20 hours~30 hours. More preferably, the melting time of the reactants may be 22 hours~28 hours. More preferably, the melting time of the reactants may be 23 hours~27 hours. More preferably, the melting time of the reactants may be 24 hours~26 hours. More preferably, the melting time of the reactants may be 24.5 hours~25.5 hours. It should be understood that a high temperature (e.g., 1900° C.) is required during the crystal growth, a plenty of heat radiation may be generated to the external environment. Further, since the crystal growth time (e.g., four days to forty days) is relatively long, the heat radiation may affect the performance of the crystal growth device. Accordingly, a circulation cooling fluid may be used to reduce the heat radiation. The circulation cooling liquid may include water, ethanol, ethylene glycol, isopropanol, n-hexane, or the like, or any combination thereof. For example, the circulation cooling liquid may include a 50:50 mixture of water and ethanol.

The Czochralski technique disclosed in the present disclosure may include a melting process, a seed crystal preheating process, a seeding process, a temperature adjustment process, a necking process, a shouldering process, an constant diameter growth process, an ending process, a cooling process, a crystal removing process, etc. The melting process may refer to a process in which the temperature may be increased to a certain value via a temperature increasing process, the reactants may be melted to form a melt, and a certain temperature (i.e., temperature gradient) can be kept in the crystal growth device. The crucible in the crystal growth device may be used as a heater, and heat may be radiated from the crucible to the surroundings to form the temperature gradient in the crystal growth device. The temperature gradient may refer to a change rate of the temperature at a certain point toward a temperature of an adjacent point in the crystal growth device, which may also be referred to as a change rate of the temperature per unit distance. Merely by way of example, a temperature change from a point M to a point N is (T1−T2), and a distance between the two points is (r1−r2), and the temperature gradient from the point M to the point N is $\Delta T=(T1-T2)/(r1-r2)$.

During the crystal growth, a suitable temperature gradient is needed. For example, during the crystal growth, a large enough temperature gradient $\Delta T$ along a vertical direction is need, which can disperse the latent heat of crystallization generated during the crystal growth, thereby keep the crystal growth stable. Meanwhile, a temperature of the melt below a growth interface should be higher than a crystallization temperature, so that the local growth of crystal would not be too fast and the growth interface would be stable, thereby keeping the growth stable. The temperature gradient may be determined based on a location of a heating center. In some embodiments, during the melting process, the reactants may be melted and then solidified to form a polycrystalline material, when a diameter of the polycrystalline material reaches 50 mm, the temperature increasing operation may be stopped. After temperature increasing operation is completed, the temperature may be maintained for 0.5 hours-1 hour. According to a melting condition of the reactants, the temperature may be continually increased or decreased. An upper limit of the temperature increasing operation may be determined according to a temperature or a heating power (e.g., a power of the induction coil) at a time when a screw rod started to be pulled up when the crystal growth device was used at the last time. For example, the heating power may be less than the heating power at the time when the pulling rod started to be pulled up at the last time by 300-500 watts. A temperature increasing rate may be determined based on the temperature at which the pulling started to be pulled up at the last time. For example, the temperature increasing rate may be a ratio the temperature and the time (e.g., 24 hours). After temperature increasing operation is completed, the temperature may be maintained for 0.5 hours-1 hour. According to a melting condition of the reactants, the temperature may be continually increased or decreased.

The seed crystal preheating process may refer to a process in which the seed crystal may be fixed on a top of the pulling rod and slowly dropped into the temperature field during the melting process, which can make a temperature of the seed crystal close to that of the melt, thereby avoiding cracking of the seed crystal when a supercooled seed crystal contacts with the melt in subsequent operations. During the seed crystal preheating process, a distance the seed crystal and an upper surface of the reactants may be controlled. Preferably, the distance the seed crystal and the upper surface of the reactants may be 5 mm~100 mm. More preferably, the distance the seed crystal and the upper surface of the reactants may be 5 mm~90 mm. More preferably, the distance the seed crystal and the upper surface of the reactants may be 5 mm~80 mm. More preferably, the distance the seed crystal and the upper surface of the reactants may be 5 mm~70 mm. More preferably, the distance the seed crystal and the upper surface of the reactants may be 5 mm~60 mm. More preferably, the distance the seed crystal and the upper surface of the reactants may be 5 mm~50 mm. More preferably, the distance the seed crystal and the upper surface of the reactants may be 5 mm~40 mm. More preferably, the distance the seed crystal and the upper surface of the reactants may be 5 mm~30 mm. More preferably, the distance the seed crystal and the upper surface of the reactants may be 5 mm~20 mm. More preferably, the distance the seed crystal and the upper surface of the reactants may be 5 mm~15 mm. More preferably, the distance the seed crystal and the upper surface of the reactants may be 6 mm~14 mm. More preferably, the distance the seed crystal and the upper surface of the reactants may be 7 mm~13 mm. More preferably, the distance the seed crystal and the upper surface of the reactants may be 8 mm~12 mm. More preferably, the distance the seed crystal and the upper surface of the reactants may be 9 mm~11 mm. During the seed crystal preheating process, a dropping speed of the seed crystal may be 50 mm/h~800 mm/h. Preferably, the dropping speed of the seed crystal may be 100 mm/h~70 mm/h. More preferably, the dropping speed of the seed crystal may be 200 mm/h~600 mm/h. More preferably, the dropping speed of the seed crystal may be 350 mm/h~450 mm/h. More preferably, the dropping speed of the seed crystal may be 370 mm/h~430 mm/h. More preferably, the dropping speed of the seed crystal may be 390 mm/h~410 mm/h. More preferably, the dropping speed of the seed crystal may be 5 mm/h~100 mm/h.

The seeding process may refer to a process in which the pulling rod may be dropped to cause the seed crystal to contact with the melt after the reactants are melted to form a melt. The temperature adjustment process may refer to a process in which a temperature in the crystal growth device may be adjusted to a suitable temperature for the crystal growth. During the temperature adjustment process, the seed crystal may be sunk by 0.1 mm~50 mm. Preferably, the seed crystal may be sunk by 1 mm~50 mm. More preferably, the seed crystal may be sunk by 10 mm~40 mm. More preferably, the seed crystal may be sunk by 20 mm~30 mm. More preferably, the seed crystal may be sunk by 21 mm~29 mm. More preferably, the seed crystal may be sunk by 22 mm~28 mm. More preferably, the seed crystal may be sunk by 23 mm~27 mm. More preferably, the seed crystal may be sunk by 24 mm~26 mm. In some embodiments, a rate of the temperature adjustment may be 100~300 watts/0.1 hour. After the temperature adjustment process is completed, the temperature inside the crystal growth device may be kept at 1950° C.~2150° C. for 0.1 hours~1 hour. Then, the screw rod may be rotated to pull the pulling rod up. After the seed crystal passed through a second cover plate and during the subsequent crystal growth process, a rotation rate of the pulling rod may be 0.01 rpm/min~35 rpm/min. More preferably, the rotation rate of the pulling rod may be 0.1 rpm/min~35 rpm/min. More preferably, the rotation rate of the pulling rod may be 1 rpm/min~35 rpm/min. More preferably, the rotation rate of the pulling rod may be 5 rpm/min~30 rpm/min. More preferably, the rotation rate of the pulling rod may be 10 rpm/min~25 rpm/min. More preferably, the rotation rate of the pulling rod may be 15 rpm/min~20 rpm/min.

The necking process may refer to a process in which the temperature may be slowly increased to cause a temperature of a zero point of the melt (i.e., a temperature of a center point of the liquid surface in crucible) to be slightly higher than the melting point of the crystal, a diameter of a newly grown crystal during the rotation and pulling up of the seed crystal may be gradually decreased. The necking process may reduce the extension of crystal dislocations from the seed crystal to a single crystal below a neck. The shouldering processing may refer to a process in which when atoms or molecules on a solid-liquid interface at a boundary between the seed crystal and the melt begin to be arranged in a structure of the seed crystal, the temperature in the temperature field may be slowly decreased according to a real-time growth rate of the crystal to expand the seed crystal according to a preset angle. In some embodiments, the shoulder angle may be 30 degrees~70 degrees. More preferably, the shoulder angle may be 40 degrees~60 degrees. More preferably, the shoulder angle may be 45 degrees~55 degrees. More preferably, the shoulder angle may be 46 degrees~54 degrees. More preferably, the shoulder angle may be 47 degrees~53 degrees. More preferably, the shoulder angle may be 48 degrees~52 degrees. More preferably, the shoulder angle may be 49 degrees~51 degrees. A shoulder length may be 40 mm~130 mm. Preferably, the shoulder length may be 50 mm~120 mm. More preferably, the shoulder length may be 60 mm~110 mm. More preferably, the shoulder length may be 70 mm~100 mm. More preferably, the shoulder length may be 80 mm~90 mm.

The constant diameter growth process may refer to a process in which a rod-like structure with a diameter determined during the shouldering process may be obtained. In some embodiments, the diameter of the crystal growth may be 10 mm~200 mm. Preferably, the length of the constant diameter of the crystal growth may be 20 mm~180 mm. More preferably, the length of the constant diameter of the crystal growth may be 50 mm~150 mm. More preferably, the length of the constant diameter of the crystal growth may be 60 mm~140 mm. More preferably, the length of the constant diameter of the crystal growth may be 70 mm~130 mm. More preferably, the length of the constant diameter of the crystal growth may be 80 mm~120 mm. More preferably, the length of the constant diameter of the crystal growth may be 90 mm~110 mm.

The ending process may refer to a process in which the crystal may be raised up to be separated from the melt when the crystal grows to a predetermined length. The ending process may be a reverse operation of the shouldering process. The diameter of the crystal may be reduced until the crystal is separated from the melt by changing a pulling speed of the pulling rod, or the diameter of the crystal may be reduced to a preset diameter such as 10 mm. An automatic control program may be used to calculate a change of the diameter of the crystal based on a predetermined parameter of the ending process, and perform the ending process according to a preset angle by increasing or decreasing the temperature. In some embodiments, an ending angle may be 30 degrees~70 degrees. Preferably, the ending angle may be 40 degrees~60 degrees. More preferably, the ending angle may be 45 degrees~55 degrees. More preferably, the ending angle may be 46 degrees~54 degrees. More preferably, the ending angle may be 47 degrees~53 degrees. More preferably, the ending angle may be 48 degrees~52 degrees. More preferably, the ending angle may be 49 degrees~51 degrees. An ending length of the crystal may be 40 mm~110 mm. More preferably, the ending length of the crystal may be 50 mm~100 mm. More preferably, the ending length of the crystal may be 60 mm~90 mm. More preferably, the ending length of the crystal may be 70 mm~80 mm.

The cooling process may refer to a process in which a temperature may be slowly decreased after the ending process is completed, to eliminate a stress within the crystal, which may be formed in the high-temperature crystal growth. The cooling process may prevent cracking of the crystal caused by a sudden drop of the temperature. In some embodiments, for the flowing gas including a mixed gas of oxygen and one or more of nitrogen or an inert gas, during the cooling process, when the temperature drops to 1400° C.~800° C., the volume ratio of oxygen in the flowing gas may be increased to cause the oxygen to effectively diffuse into the crystal. In some embodiments, during increasing the volume ratio of oxygen, a cooling rate of the crystal may also be slowed, or a stepwise cooling process may be performed to cause the oxygen to diffuse more fully. In some embodiments, when the temperature drops to be 1400° C. and 800° C., the volume of oxygen in the flowing gas may be increased to 1%-30% during the cooling process. More preferably, when the temperature drops to be 1400° C.~800° C., the volume ratio of oxygen in the flowing gas may be increased to 2%-28%. More preferably, when the temperature drops to be 1400° C.~800° C., the volume ratio of oxygen in the flowing gas may be increased to 5%-25%. More preferably, when the temperature drops to be 1400° C.~800° C., the volume ratio of oxygen in the flowing gas may be increased to 10%~20%. More preferably, when the temperature drops to be 1400° C.~800° C., the volume ratio of oxygen in the flowing gas may be increased to 13%~17%. More preferably, when the temperature drops to be 1400° C.~800° C., the volume ratio of oxygen in the flowing gas may be increased to 14%-16%. When the temperature is lower than 800° C., the volume ratio of oxygen in the flowing gas may be at least decreased to a volume ratio of oxygen in a previous crystal growth process, which may be 0.001%~20% and other mentioned temperature. In some embodiments, a cooling time of the crystal may be 20 hours~100 hours. More preferably, the cooling time of crystal may be 30 hours~90 hours. More preferably, the cooling time of the crystal may be 40 hours~80 hours. More preferably, the cooling time of the crystal may be 50 hours~70 hours. More preferably, the cooling time of the crystal may be 55 hours~65 hours. In some embodiments, assuming that T is the temperature after the ending process, a decreasing rate of a crystal temperature during the cooling process may be T/(20–100) hours. In some embodiments, the decreasing rate of the crystal temperature may be 15° C./h~95° C./h. More preferably, the decreasing rate of the crystal temperature may be 20° C./h~65° C./h. More preferably, the decreasing rate of the crystal temperature may be 23° C./h~47° C./h. More preferably, the decreasing rate of the crystal temperature may be 26° C./h~38° C./h. More preferably, the decreasing rate of the crystal temperature may be 28° C./h~34° C./h. When an output heating power (e.g., the heating power of the induction coil) is 0, the crystal growth may end.

The crystal removing process may refer to a process in which the grown crystal may be taken out from the crystal growth device when an internal temperature of the crystal growth device drops to the room temperature. In the crystal growth process, according to a setting of various process parameters in different stages of the crystal growth process, the growth rate of the crystal may be 0.01 mm/h~6 mm/h. Preferably, the growth rate of the crystal may be 0.1 mm/h~6 mm/h. More preferably, the growth rate of the crystal may be 1 mm/h~6 mm/h. More preferably, the growth rate of the crystal may be 2 mm/h~5 mm/h. More preferably, the growth rate of the crystal may be 3 mm/h~4 mm/h. A diameter of an obtained crystal may be 50 mm~115 mm. A diameter of a grown crystal may be equal to or greater than 60 mm, such as 60 mm-105 mm (e.g., 60 mm), 70 mm-90 mm (e.g., 80 mm). The constant diameter may be reached to more than 130 mm, such as 130 mm-200 mm, 150 mm-180 mm, or 160 mm-170 mm.

In some embodiments, one or more processes in the crystal growth may be controlled by a PID controller. The one or more process may include but are not limited to the necking process, the shouldering process, the constant diameter growth process, the ending process, the cooling process, etc. In some embodiments, the PID parameter may be 0.1~5. Preferably, the PID parameter may be 0.5~4.5. More preferably, the PID parameter may be 1~4. More preferably, the PID parameter may be 1.5~3.5. More preferably, the PID parameter may be 2~3. More preferably, the PID parameter may be 2.5~3.5.

It should be noted that the embodiments mentioned above are only used to illustrate the technical solutions of the present disclosure but not to limit the technical solutions. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

FIG. 2 is a schematic diagram illustrating an exemplary temperature field device according to some embodiments of the present disclosure. It should be noted that FIG. 2 is provided for illustration purposes and does not limit the shape and/or structure of the temperature field device. The temperature field device 200 may be mounted in a crystal growth device to provide temperature gradient for crystal growth and ensure the stability of a crystallization process of the crystal. As shown in FIG. 2, the temperature field device 200 may include a bottom plate 202, a first drum 204, a second drum 206, a filler 208, a first cover plate 210, a second cover plate 212, a heater 226, an observation unit 218, a sealing ring 220, a pressure ring 222, and a gas channel 224. The temperature field device 200 may be placed in the crystal growth device such as a single crystal growth furnace. Specifically, the temperature field device 200 may be placed in an induction coil 216 in the single crystal growth, the crucible 214 may be placed in the temperature field device 200, and the heater 226 may be mounted above the crucible 214.

The bottom plate 202 may be mounted on a bottom of the temperature field device 200 to support other components of the temperature field device 200, for example, the first drum 204, the second drum 206, the filler 208, etc. In some embodiments, a material of the bottom plate 202 may include a heat reflective material with a relatively high reflection coefficient, for example, gold, silver, nickel, aluminum foil, copper, molybdenum, coated metal, stainless steel, or the like, or any combination thereof. Preferably, the bottom plate 202 may include a copper plate. In some embodiments, a diameter of the bottom plate 202 may be 200 mm~500 mm. Preferably, the diameter of the bottom plate 202 may be 250 mm~450 mm. More preferably, the diameter of the bottom plate 202 may be 300 mm~400 mm. More preferably, the diameter of the bottom plate 202 may be 310 mm~390 mm. More preferably, the diameter of the bottom plate 202 may be 320 mm~380 mm. More preferably, the diameter of the bottom plate 202 may be 430 mm~370 mm. More preferably, the diameter of the bottom plate 202 may be 440 mm~360 mm. In some embodiments, a thickness of bottom plate 202 may be 10 mm~40 mm. Preferably, the thickness of the bottom plate 202 may be 15 mm~35 mm. More preferably, the thickness of the bottom plate 202 may be 20 mm~30 mm. More preferably, the thickness of the bottom plate 202 may be 21 mm~29 mm. More preferably, the thickness of the bottom plate 202 may be 22 mm~28 mm. More preferably, the thickness of the bottom plate 202 may be 23 mm~27 mm. More preferably, the thickness of the bottom plate 202 may be 24 mm~26 mm. Since the temperature field device 200 may be placed in a furnace body of the single crystal growth furnace, the bottom plate 202 may be placed or mounted on a mounting plate of the furnace body. A mode of placing or disposing the bottom plate 202 may include a welding mode, a riveting mode, a bolt mode, a bonding mode, or the like, or any combination thereof. A level of the bottom plate 202 may be less than 0.5 mm/m. Preferably, the level of the bottom plate 202 may be less than 0.4 mm/m. More preferably, the level of the bottom plate 202 may be less than 0.3 mm/m. More preferably, the level of the bottom plate 202 may be less than 0.2 mm/m. More preferably, the level of the bottom plate 202 may be less than 0.1 mm/m. More preferably, level of the bottom plate 202 may be less than 0.09 mm/m. More preferably, the level of the bottom plate 202 may be less than 0.08 mm/m. More preferably, the level of the bottom plate 202 may be less than 0.07 mm/m. More preferably, the level of the bottom plate 202 may be less than 0.06 mm/m. More preferably, the level of the bottom plate 202 may be less than 0.05 mm/m. More preferably, the level of the bottom plate 202 may be less than 0.04 mm/m. More preferably, the level of the bottom plate 202 may be less than 0.03 mm/m. More preferably, the level of the bottom plate 202 may be less than 0.02 mm/m. More preferably, the level of the bottom plate 202 may be less than 0.01 mm/m. When the temperature field device 200 is used, an internal temperature may reach a relatively high temperature, for example, 1900° C. Therefore, it is necessary to reduce heat radiation of the temperature field device 200 to prevent the furnace body from being damaged by excessive heat. In this case, the bottom plate 202 may be provided with channel(s) for circulation cooling fluid, circulation cooling fluid which may be used to absorb the heat inside the temperature field device 200, thereby insulating the heat and reducing the heat radiation. The channel(s) may be mounted inside the bottom plate 202 with a spiral shape or a snake shape. The cooling liquid may include water, ethanol, ethylene glycol, isopropyl alcohol, n-hexane or the like, or any combination thereof. Merely by way of example, the cooling liquid may include a 50:50 mixed liquid of water and ethanol. A count of the circulating cooling liquid channel(s) may be one or more, for example, 1 to 3. In some embodiments, a diameter of the circulating cooling liquid channel(s) may be 5 mm~25 mm. Preferably, the diameter of the circulating cooling liquid channel(s) may be 10 mm~20 mm. More preferably, the diameter of the circulating cooling liquid channel(s) may be 11 mm~19 mm. More preferably, the diameter of the circulating cooling liquid channel(s) may be 12 mm~18 mm. More preferably, the diameter of the circulating cooling liquid channel(s) may be 13 mm~17 mm. More preferably, the diameter of the circulating cooling liquid channel(s) may be 14 mm~15 mm.

The first drum 204 may be mounted on the bottom plate 202 and constitute an outer wall of the temperature field device 200. The bottom plate 202 may cover an open end of the first drum 204. The first drum 204 may be mounted on the bottom plate 202 via a welding mode, a riveting mode, a bolt mode, a bonding mode, or the like, or any combination thereof, to support the temperature field device 200. The first drum 204 may achieve the sealing and the heat preservation of the temperature field device 200 together with other components (e.g., the bottom plate 202, the first cover plate 210) of the temperature field device 200. The first drum 204 may be made of heat resistant material such as zirconia, alumina, graphite, ceramics, or the like, or any combination thereof. When the first drum 204 is being mounted, a concentricity of the first drum 204 and the bottom plate 202 may be less than 1 mm. Preferably, the concentricity of the first drum 204 and the bottom plate 202 may be less than 0.9 mm. More preferably, the concentricity of the first drum 204 and the bottom plate 202 may be less than 0.8 mm. More preferably, the concentricity of the first drum 204 and the bottom plate 202 may be less than 0.7 mm. More preferably, the concentricity of the first drum 204 and the bottom plate 202 may be less than 0.6 mm. More preferably, the concentricity of the first drum 204 and the bottom plate 202 may be less than 0.5 mm. More preferably, the concentricity of the first drum 204 and the bottom plate 202 may be less than 0.4 mm. More preferably, the concentricity of the first drum 204 and the bottom plate 202 may be less than 0.3 mm. More preferably, the concentricity of the first drum 204 and the bottom plate 202 may be less than 0.2 mm. More preferably, the concentricity of the first drum 204 and the bottom plate 202 may be less than 0.1 mm. A perpendicularity between the first drum 204 and the bottom plate 202 may be less than 0.2 degrees. Preferably, the perpendicularity of the first drum 204 and the bottom plate 202 may be less than 0.15 degrees. More preferably, the perpendicularity of the first drum 204 and the bottom plate 202 may be less than 0.1 degrees. More preferably, the perpendicularity of the first drum 204 and the bottom plate 202 may be less than 0.05 degrees. More preferably, the perpendicularity of the first drum 204 and the bottom plate 202 may be less than 0.03 degrees. In some embodiments, the first drum 204 may be made of quartz, corundum, alumina, zirconia, graphite, carbon fiber, or the like, or any combination thereof. According to a size of the bottom plate 202, an inner diameter of the first drum 204 may be 180 mm~450 mm. Preferably, the inner diameter of the first drum 204 may be 200 mm~530 mm. More preferably, the inner diameter of the first drum 204 may be 220 mm~510 mm. More preferably, the inner diameter of the first drum 204 may be 250 mm~380 mm. More preferably, the inner diameter of the first drum 204 may be 270 mm~360 mm. More preferably, the inner diameter of the first drum 204 may be 300 mm~330 mm. More preferably, the inner diameter of the first drum 204 may be 310 mm~320 mm. In some embodiments, a thickness of the first drum 204 be 1 mm~15 mm. Preferably, the thickness of the first drum 204 be 3 mm~12 mm. More preferably, the thickness of the first drum 204 be 5 mm~10 mm. More preferably, the thickness of the first drum 204 be 6 mm~9 mm. More preferably, the thickness of the first drum 204 be 7 mm~8 mm. A height of the first drum 204 may be 600 mm~1600 mm. Preferably, the height of the first drum 204 may be 700 mm~1500 mm. More preferably, the height of the first drum 204 may be 800 mm~1400 mm. More preferably, the height of the first drum 204 may be 900 mm~1300 mm. More preferably, the height of the first drum 204 may be 1000 mm~1200 mm. More preferably, the height of the first drum 204 may be 1050 mm~1150 mm. More preferably, the height of the first drum 204 may be 1060 mm~1140 mm. More preferably, the height of the first drum 204 may be 1070 mm~1130 mm. More preferably, the height of the first drum 204 may be 1080 mm~1120 mm. More preferably, the height of the first drum 204 may be 1090 mm~1110 mm. More preferably, the height of the first drum 204 may be 1095 mm~105 mm.

The second drum 206 may be mounted in the first drum 204. In some embodiments, the second drum 206 may be made of a material with relatively good heat resistance to maintain a temperature of the crystal growth stable. The second drum 206 may be made of zirconia, alumina, graphite, ceramics, etc. More preferably, the second drum 206 may include a zirconium tube made of zirconia. To match with the size of the first drum 204, an inner diameter of the second drum 206 may be 70 mm~300 mm. Preferably, the inner diameter of the second drum 206 may be 100 mm~270 mm. More preferably, the inner diameter of the second drum 206 may be 120 mm~250 mm. More preferably, the inner diameter of the second drum 206 may be 150 mm~220 mm. More preferably, the inner diameter of the second drum 206 may be 170 mm~200 mm. More preferably, the inner diameter of the second drum 206 may be 180 mm~270 mm. A thickness of the second drum 206 may be 8 mm~30 mm. Preferably, the thickness of the second drum 206 may be 10 mm~30 mm. More preferably, the thickness of the second drum 206 may be 15 mm~25 mm. More preferably, the thickness of the second drum 206 may be 16 mm~24 mm. More preferably, the thickness of the second drum 206 may be 17 mm~23 mm. More preferably, the thickness of the second drum 206 may be 18 mm~22 mm. More preferably, the thickness of the second drum 206 may be 19 mm~21 mm. A height of the second drum 206 may be 500 mm~1500 mm. Preferably, the height of the second drum 206 may be 600 mm~1400 mm. More preferably, the height of the second drum 206 may be between 700 mm~1300 mm. More preferably, the height of the second drum 206 may be between 800 mm~1200 mm. More preferably, the height of the second drum 206 may be 900 mm~1100 mm. More preferably, the height of the second drum 206 may be 950 mm~1050 mm. More preferably, the height of the second drum 206 may be 960 mm~1040 mm. More preferably, the height of the second drum 206 may be 970 mm~1030 mm. More preferably, the height of the second drum 206 may be 980 mm~1020 mm. More preferably, the height of the second drum 206 may be 990 mm~1010 mm. More preferably, the height of the second drum 206 may be 995 mm~1005 mm. In some embodiments, an end of the second drum 206 may be placed or mounted on the bottom plate 202, for example, via a bonding connection, a welding connection, a riveting connection, a key connection, a bolt connection, a buckle connection, or the like, or any combination thereof. A concentricity of the second drum 206 and the bottom plate 202 may be less than 1 mm. Preferably, the concentricity of the second drum 206 and the bottom plate 202 may be less than 0.9 mm. More preferably, the concentricity of the second drum 206 and the bottom plate 202 may be less than 0.8 mm. More preferably, the concentricity of the second drum 206 and the bottom plate 202 may be less than 0.7 mm. More preferably, the concentricity of the second drum 206 and the bottom plate 202 may be less than 0.6 mm. More preferably, the concentricity of the second drum 206 and the bottom plate 202 may be less than 0.5 mm. More preferably, the concentricity of the second drum 206 and the bottom plate 202 may be less than 0.4 mm. More preferably, the concentricity of the second drum 206 and the bottom plate 202 may be less than 0.3 mm. More preferably, the concentricity of the second drum 206 and the bottom plate 202 may be less than 0.2 mm. More preferably, the concentricity of the second drum 206 and the bottom plate 202 may be less than 0.1 mm. More preferably, the concentricity of the second drum 206 and the bottom plate 202 may be less than 0.05 mm. A perpendicularity of the second drum 206 may be less than 0.2 degrees. Preferably, the perpendicularity of the second drum 206 may be less than 0.15 degrees. More preferably, the perpendicularity of the second drum 206 may be less than 0.1 degree. More preferably, the perpendicularity of the second drum 206 may be less than 0.08 degrees. More preferably, the perpendicularity of the second drum 206 may be less than 0.05 degrees. In some embodiments, when the second drum 206 is mounted on the bottom plate 202, according to different heights, the second drum 206 may be in different mounting states. When the height of the second drum 206 is the same as that of the first drum 204, the mounting state of the second drum 206 may be similar to that of the first drum 204, that is, an open end of the second drum 206 may be connected to the bottom plate 202 and the other open end may be connected to the first cover plate 210. When the height of the second drum 206 is less than that of the first drum 204, the other open end of the second drum 206 may be connected to other components (e.g., the second cover plate 212) of the temperature field device 200. The second cover plate 212 may cover the other open end of the second drum 206. Meanwhile, a size and/or a shape (e.g., a diameter of a circle cover plate) of the second cover plate 212 may match a cross section of the first drum 204 to achieve a seamless connection with the first drum 204. In some embodiments, the second drum 206 may not be mounted on the bottom plate 202. When the height of the second drum 206 is less than that of the first drum 204, an end of the second drum 206 may be mounted on other components (e.g., the first cover plate 210, the second cover plate 212) of the temperature field device 200, and the other end of the second drum 206 may be kept at a certain distance from the bottom plate 202 (e.g., in a floating state).

The filler 208 may be filled in the second drum 206, and/or a space between the first drum 204 and the second drum 206. The filler 208 filled in the second filler 206 may be at least used to support the crucible 214 and cover at least a portion of the crucible 214. Reactants for crystal growth may be placed in the crucible 214 to react. The filler 208 may be configured for heat preservation. In some embodiments, a height and/or a tightness of the filler 208 may change a position of a component (e.g., the crucible 214) supported by the filler 208 and/or a space volume of the heat dissipation in temperature field device 200. Different stable temperature gradients for different crystal growths may be obtained by changing the height and/or the tightness of the filler 208. The height of the filler 208 may determine a position of a heating center, which may affect the temperature gradient above a melt interface in a vertical direction. A particle size and/or a tightness of the filler 208 may determine the heat insulation capacity of the filler 208 (e.g., the smaller the particle size is and the larger the tightness is, the stronger the heat insulation capacity and the stability may be), which may affect the temperature gradient below the melt interface in the vertical direction. Different heights, particle sizes, and/or tightness of the filler 208 may correspond to different temperature gradients. In some embodiments, when the second drum 206 is cracked, the filler 208 filled in the space between the first drum 204 and the second drum 206 may act as a heat insulation layer to prevent a change caused by a communication between the temperature field device 200 and the external environment, which may affect the crystal growth. The heat insulation layer formed by the filler 208 may maintain the temperature gradient in the temperature field device 200 in the above-mentioned case to avoid the sudden change of the temperature. In some embodiments, the filler 208 may made of heat resistance material. A shape of the filler 208 may include granular, brick, felt, or the like, or any combination thereof. The filler 208 may include zircon sand (zirconium silicate compound), zirconia particles, alumina particles, etc. A particle size of the filler 208 may be 5 mesh~200 mesh. Preferably, the particle size of the filler 208 may be 10 mesh~190 mesh. More preferably, the particle size of the filler 208 may be 20 mesh~180 mesh. More preferably, the particle size of the filler 208 may be 30 mesh~170 mesh. More preferably, the particle size of the filler 208 may be 40 mesh~160 mesh. More preferably, the particle size of the filler 208 may be 50 mesh~150 mesh. More preferably, the particle size of the filler 208 may be 60 mesh~140 mesh. More preferably, the particle size of the filler 208 may be 70 mesh~130 mesh. More preferably, the particle size of the filler 208 may be 80 mesh~120 mesh. More preferably, the particle size of the filler 208 may be 90 mesh~110 mesh. More preferably, the particle size of the filler 208 may be 95 mesh~105 mesh. In some embodiments, the filler 208 may include a substance with a shape of felt (e.g., a zirconia felt). In some embodiments, the filler 208 may include a mixture of a substance with a shape of granular, a substance with a shape of brick, and/or a substance with a shape of felt, for example, a mixture of one or more of the zirconia felt, the zircon sand, the zirconia particles, or the alumina particles.

In some embodiments, the filler 208 filled in the second drum 206 may be used to support the crucible 214 containing the reactants for the crystal growth. The filler 208 may cover a portion of the crucible 214, for example, a bottom and a side wall of the crucible 214. To prevent the filler 208 from falling into the reactants in the crucible 214, an upper edge of the crucible 214 may be higher than the filling height of the filler 208 filled in the second drum 206. In some embodiments, the second drum 206 may prevent the filler 208 filled in the space between the first drum 204 and the second drum 206 from falling into the crucible 214. In some embodiments, the crucible 214 may be made of iridium (Ir), molybdenum (Mo), tungsten (W), rhenium (Re), graphite (C), tungsten-molybdenum alloy, or the like, or any combination thereof. Preferably, the crucible 214 may be made of iridium. In some embodiments, a diameter of the crucible 214 may be 60 mm~250 mm. Preferably, the diameter of the crucible 214 may be 80 mm~220 mm. More preferably, the diameter of the crucible 214 may be 100 mm~200 mm. More preferably, the diameter of the crucible 214 may be 110 mm~190 mm. More preferably, the diameter of the crucible 214 may be 120 mm~180 mm. More preferably, the diameter of the crucible 214 may be 130 mm~170 mm. More preferably, the diameter of the crucible 214 may be 140 mm~160 mm. More preferably, the diameter of the crucible 214 may be 145 mm~155 mm. A thickness of the crucible 214 may be 2 mm~4 mm. Preferably, the thickness of the crucible 214 may be 2.2 mm~3.8 mm. More preferably, the thickness of the crucible 214 may be 2.5 mm~3.5 mm. More preferably, the thickness of the crucible 214 may be 2.6 mm~3.4 mm. More preferably, the thickness of the crucible 214 may be 2.7 mm~3.3 mm. More preferably, the thickness of the crucible 214 may be 2.8 mm~3.2 mm. More preferably, the thickness of the crucible 214 may be 2.9 mm~3.1 mm. A height of crucible 214 may be 60 mm~250 mm. Preferably, the height of the crucible 214 may be 80 mm~220 mm. More preferably, the height of the crucible 214 may be 100 mm~200 mm. More preferably, the height of the crucible 214 may be 110 mm~190 mm. More preferably, the height of the crucible 214 may be 120 mm~180 mm. More preferably, the height of the crucible 214 may be 130 mm~170 mm. More preferably, the height of the crucible 214 may be 140 mm~160 mm. More preferably, the height of the crucible 214 may be 145 mm~155 mm.

The heater 226 may be mounted above the crucible 214. In some embodiments, the heater 226 may be used to reduce a temperature gradient above the crucible 214. A position of the heater 226 and/or a size of an inner diameter of the heater 226 may make that a temperature for annealing can be provided when the seed crystal passes through the heater 226, thereby performing the annealing on the crystal during the crystal growth. In some embodiments, the heater 226 may be made of one or more of iridium (Ir), platinum (Pt), molybdenum (Mo), tungsten (W), rhenium (Re), graphite (C), or a material which has a relatively high melting point and can be heated by electromagnetic induction. In some embodiments, an outer diameter of the heater 226 may be 60 mm~260 mm. More preferably, the outer diameter of the heater 226 may be 80 mm~220 mm. More preferably, the outer diameter of the heater 226 may be 100 mm~200 mm. More preferably, the outer diameter of the heater 226 may be 110 mm~190 mm. More preferably, the outer diameter of the heater 226 may be 120 mm~180 mm. More preferably, the outer diameter of the heater 226 may be 130 mm~170 mm. More preferably, the outer diameter of the heater 226 may be 140 mm~160 mm. More preferably, the outer diameter of the heater 226 may be 145 mm~155 mm. An inner diameter of the heater 226 may be 40 mm~240 mm. Preferably, the inner diameter of the heater 226 may be 60 mm~220 mm. More preferably, the inner diameter of the heater 226 may be 80 mm~200 mm. More preferably, the inner diameter of the heater 226 may be 90 mm~190 mm. More preferably, the inner diameter of the heater 226 may be 100 mm~180 mm. More preferably, the inner diameter of the heater 226 may be 110 mm~170 mm. More preferably, the inner diameter of the heater 226 may be 120 mm~160 mm. More preferably, the inner diameter of the heater 226 may be 130 mm~150 mm. More preferably, the inner diameter of the heater 226 may be 135 mm~145 mm. A thickness of the heater 226 may be 2 mm~10 mm. Preferably, the thickness of the heater 226 may be 3 mm~9 mm. More preferably, the thickness of the heater 226 may be 4 mm~8 mm. More preferably, the thickness of the heater 226 may be 5 mm~7 mm. More preferably, the thickness of the heater 226 may be 5.5 mm~6.5 mm. More preferably, the thickness of the heater 226 may be 5.6 mm~6.4 mm. More preferably, the thickness of the heater 226 may be 5.8 mm~6.2 mm. More preferably, the thickness of the heater 226 may be 5.9 mm~6.1 mm. A height of the heater 226 may be 2 mm~200 mm. Preferably, the height of the heater 226 may be 10 mm~180 mm. More preferably, the height of the heater 226 may be 30 mm~160 mm. Preferably, the height of the heater 226 may be 50 mm~120 mm. More preferably, the height of the heater 226 may be 60 mm~110 mm. More preferably, the height of the heater 226 may be 70 mm~100 mm. More preferably, the height of the heater 226 may be 80 mm~90 mm. More preferably, the height of the heater 226 may be 85 mm~95 mm.

Figure 3:
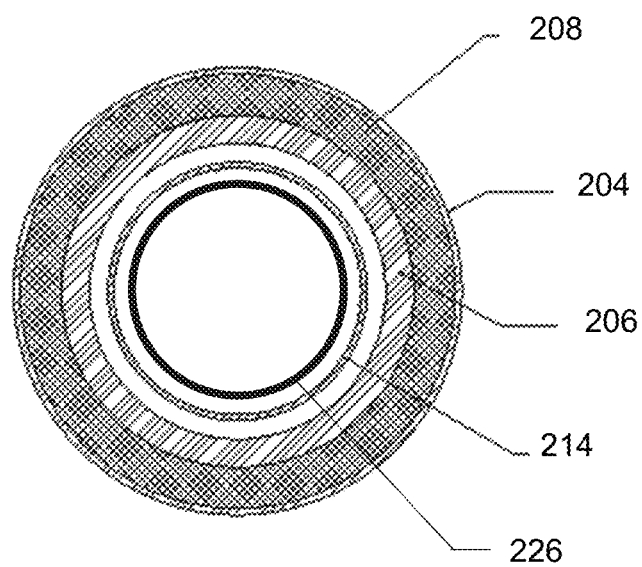
FIG. 3 is a schematic diagram illustrating a top view of a cross-section of an exemplary temperature field device according to some embodiments of the present disclosure.

FIG. 3 is a schematic diagram illustrating a top view of a cross-section of an exemplary temperature field device according to some embodiments of the present disclosure. As shown in FIG. 3, a periphery of the temperature field device 300 may be the first drum 204. The space between the second drum 206 and the first drum 204 may be filled with the filler 208. The crucible 214 may be placed in the second drum 206 and supported by the filler 208 which may be filled at the bottom of the second drum 206. The heater 226 may be mounted above the crucible 214. It can be seen that, from outside to inside, components of the temperature field device 300 may successively include the first drum 204, the filler 208, the second drum 206, the crucible 214, and the heater 226. The above-mentioned components may form a concentric circle and a concentricity may be less than 1 mm. Preferably, the concentricity may be less than 0.9 mm. More preferably, the concentricity may be less than 0.8 mm. More preferably, the concentricity may be less than 0.7 mm. More preferably, the concentricity may be less than 0.6 mm. More preferably, the concentricity may be less than 0.5 mm. More preferably, the concentricity may be less than 0.4 mm. More preferably, the concentricity may be less than 0.3 mm. More preferably, the concentricity may be less than 0.2 mm. More preferably, the concentricity may be less than 0.1 mm. The formed concentric circle may be beneficial for growing the crystal, observing the crystal growth, introducing flowing gas, and pulling up the crystal.

In some embodiments, the crucible 214 may be used as a heater to melt the reactants contained therein to facilitate subsequent crystal growth. An induction coil (e.g., the induction coil 216 illustrated in FIG. 2) surrounding the outer wall of the first drum 204 may generate an alternating magnetic field when an alternating current with a certain frequency is passed. A closed induced current (i.e., an eddy current) may be generated in a conductor (e.g., crucible 214) caused by the electromagnetic induction of the alternating magnetic field. The induced current may be unevenly distributed on a cross section of the conductor and the electrical energy of a high-density current on a surface of the conductor may be converted into heat energy to increase the temperature of the conductor to melt the reactants. The induction coil 216 may include a coil with 5 turns~14 turns. Preferably, the induction coil 216 may include a coil with 6 turns~13 turns. More preferably, the induction coil 216 may include a coil with 7 turns~12 turns. More preferably, the induction coil 216 may include a coil with 8 turns~11 turns. More preferably, the induction coil 216 may include a coil with 9 turns~10 turns. An induction frequency may be 2 kHz~15 kHz. More preferably, the induction frequency may be 3 kHz~14 kHz. More preferably, the induction frequency may be 4 kHz~13 kHz. More preferably, the induction frequency may be 5 kHz~12 kHz. More preferably, the induction frequency may be 6 kHz~11 kHz. More preferably, the induction frequency may be 7 kHz~10 kHz. More preferably, the induction frequency may be 8 kHz~9 kHz. An induction rated power of the induction coil 216 may be 20 kW~60 kW. Preferably, the induction rated power of the induction coil 216 may be 20 kW~50 kW. More preferably, the induction rated power of the induction coil 216 may be 30 kW~45 kW. More preferably, the induction rated power of the induction coil 216 may be 36 kW~44 kW. More preferably, the induction rated power of the induction coil 216 may be 37 kW~43 kW. More preferably, the induction rated power of the induction coil 216 may be 38 kW~42 kW. More preferably, the induction rated power of the induction coil 216 may be 39 kW~41 kW. An inner diameter of a cylinder enclosed by the induction coil 216 may be 180 mm~430 mm. Preferably, the inner diameter of the cylinder enclosed by the induction coil 216 may be 200 mm~400 mm. More preferably, the inner diameter of the cylinder enclosed by the induction coil 216 may be 250 mm~350 mm. More preferably, the inner diameter of the cylinder enclosed by the induction coil 216 may be 270 mm~330 mm. More preferably, the inner diameter of the cylinder enclosed by the induction coil 216 may be 290 mm~310 mm. More preferably, the inner diameter of the cylinder enclosed by the induction coil 216 may be 295 mm~305 mm. A height of the cylinder enclosed by the induction coil 216 may be 150 mm~350 mm. Preferably, the height of the cylinder enclosed by the induction coil 216 may be 180 mm~330 mm. More preferably, the height of the cylinder enclosed by the induction coil 216 may be 200 mm~310 mm. More preferably, the height of the cylinder enclosed by the induction coil 216 may be 220 mm~290 mm. More preferably, the height of the cylinder enclosed by the induction coil 216 may be 240 mm~270 mm. More preferably, the height of the cylinder enclosed by the induction coil 216 may be 250 mm~260 mm. In some embodiments, a filling height of the filler 208 may result in that a vertical distance between an upper edge of the crucible 214 and an upper edge of the induction coil 216 is 0 mm~∓50 mm, wherein "−" represents that the upper edge of the crucible 214 is lower than the upper edge of the induction coil, and "+" represents that the upper edge of the crucible 214 is higher than the upper edge of the induction coil 216. Preferably, the vertical distance between the upper edge of the crucible 214 and the upper edge of the induction coil 216 may be 5 mm∓45 mm. More preferably, the vertical distance between the upper edge of the crucible 214 and the upper edge of the induction coil 216 may be 10 mm∓40 mm. More preferably, the vertical distance between the upper edge of the crucible 214 and the upper edge of the induction coil 216 may be 15 mm∓35 mm. More preferably, the vertical distance between the upper edge of crucible 214 and the upper edge of the induction coil 216 may be 20 mm∓30 mm. More preferably, the vertical distance between the upper edge of the crucible 214 and the upper edge of the induction coil 216 may be 22 mm∓28 mm. More preferably, the vertical distance between the upper edge of crucible 214 and the upper edge of the induction coil 216 may be 24∓26 mm. The temperature gradient of the temperature field device 200 can be adjusted by changing a relative position between the crucible 214 and the induction coil 216. For example, when the crucible 214 is totally within the coil range of the induction coil 216, the heat generated by the crucible 214 may be relatively large; whereas, when only a portion of the crucible 214 is in the coil range of the induction coil 216, the heat generated by the crucible 214 may be relatively small, accordingly, the heat position and/or a space size of heat dissipation in temperature field device 200 may be determined, and the temperature field device 200 may be further affected.

The first cover plate 210 may be mounted on a top of the temperature field device 200, and may be used to seal the temperature field device 200 together with other components (e.g., the first drum 204). The first cover plate 210 may cover the other open end of the first drum 204. The first cover plate 210 may be connected to the first drum 204 via a welding connection, a riveting connection, a bolt connection, a bonding connection, or the like, or any combination thereof. For example, a silicone sealing ring may be mounted at the joint between the first cover plate 210 and the first drum 204, and a screw may be used to screw and seal them. In some embodiments, the material of the first cover plate 210 may be similar to that of the bottom plate 202. The first cover plate 210 may be made of a material with a relatively high reflection coefficient, for example, gold, silver, nickel, aluminum foil, copper, molybdenum, coated metal, stainless steel, or the like, or any combination thereof. Preferably, the second cover plate 212 may include a copperplate. A concentricity of the first cover plate 210 and the first drum 204 may be less than 0.5 mm. Preferably, the concentricity of the first cover plate 210 and the first drum 204 may be less than 0.4 mm. More preferably, the concentricity of the first cover plate 210 and the first drum 204 may be less than 0.3 mm. More preferably, the concentricity of the first cover plate 210 and the first drum 204 may be less than 0.2 mm. More preferably, the concentricity of the first cover plate 210 and the first drum 204 may be less than 0.1 mm. In some embodiments, a diameter of the first cover plate 210 may be 200 mm~500 mm. More preferably, the diameter of the first cover plate 210 may be 250 mm~450 mm. More preferably, the diameter of the first cover plate 210 may be 300 mm~400 mm. More preferably, the diameter of the first cover plate 210 may be 310 mm~390 mm. More preferably, the diameter of the first cover plate 210 may be 320 mm~380 mm. More preferably, the diameter of the first cover plate 210 may be 430 mm~370 mm. More preferably, the diameter of the first cover plate 210 may be 440 mm~360 mm. In some embodiments, a thickness of the first cover plate 210 may be 10 mm~40 mm. Preferably, the thickness of the first cover plate 210 may be 15 mm~35 mm. Preferably, the thickness of the first cover plate 210 may be 20 mm~30 mm. More preferably, the thickness of the first cover plate 210 may be 21 mm~29 mm. More preferably, the thickness of the first cover plate 210 may be 22 mm~28 mm. More preferably, the thickness of the first cover plate 210 may be 23 mm~27 mm. More preferably, the thickness of the first cover plate 210 may be 24 mm~26 mm. In some embodiments, the first cover plate 210 may include at least two first through holes. The first through-hole may be used to pass a gas. For example, the first through-hole may constitute a channel for the gas to enter and/or exit the temperature field device 200. The gas may be introduced into the temperature field device 200 through one or more of the first through holes and the gas may be discharged from the remaining first through holes. In some embodiments, the gas may include a mixed gas of oxygen and one or more of nitrogen and inert gas. The inert gas may include nitrogen, helium, neon, argon, krypton, xenon, radon, etc. According to the characteristics and size of the crystal to be grown, a flow rate of the flowing gas introduced into the temperature field device 200 may be 0.01 L/min~50 L/min. Preferably, the flow rate of the introduced flowing gas may be 0.1 L/min~50 L/min. More preferably, the flow rate of the introduced flowing gas may be 1 L/min~50 L/min. More preferably, the flow rate of the introduced flowing gas may be 5 L/min~45 L/min. More preferably, the flow rate of the introduced flowing gas may be 10 L/min~40 L/min. More preferably, the flow rate of the introduced flowing gas may be 15 L/min~35 L/min. More preferably, the flow rate of the introduced flowing gas may be 20 L/min~30 L/min. More preferably, the flow rate of the introduced flowing gas may be 21 L/min~29 L/min. More preferably, the flow rate of the introduced flowing gas may be 22 L/min~28 L/min. More preferably, the flow rate of the introduced flowing gas may be 23 L/min~27 L/min. More preferably, the flow rate of the introduced flowing gas may be 24 L/min~26 L/min.

Figure 4:
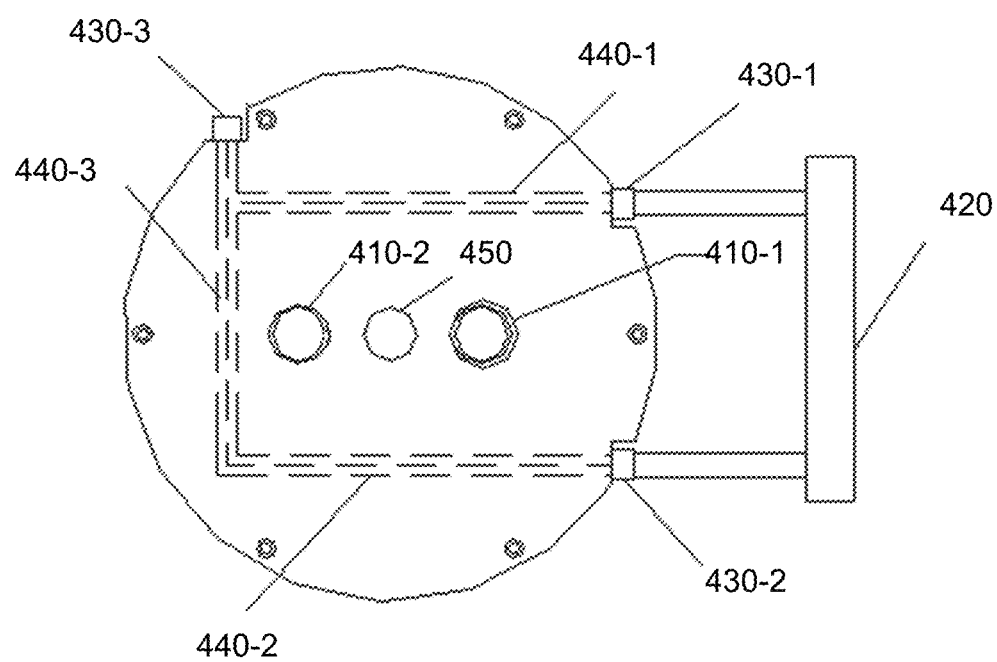
FIG. 4 is a schematic diagram illustrating a top view of an exemplary first cover plate according to some embodiments of the present disclosure.

In some embodiments, other components may be mounted on the first cover plate 210. FIG. 4 is a schematic diagram illustrating atop view of an exemplary first cover plate according to some embodiments of the present disclosure. As shown in FIG. 4, the first cover plate 210 may include two first through holes 410-1 and 410-2 through which a gas may enter and/or exits the temperature field device 200. In some embodiments, diameters of the first through holes 410-1 and 410-2 may be 15 mm~30 mm. Preferably, the diameters of the first through holes 410-1 and 410-2 may be 18 mm~27 mm. More preferably, the diameters of the first through holes 410-1 and 410-2 may be 20 mm~25 mm. More preferably, the diameters of the first through holes 410-1 and 410-2 may be 21 mm~24 mm. More preferably, the diameters of the first through holes 410-1 and 410-2 may be 22 mm~23 mm. In some embodiments, rotation central axes of the first through holes 410-1 and 410-2 may be perpendicular to the horizontal plane. In some embodiments, the rotation central axes of the first through holes 410-1 and 410-2 may be at an angle of 3 degrees~20 degrees with a vertical line of the horizontal plane. Preferably, the rotation central axes of the first through holes 410-1 and 410-2 may be at an angle of 5 degrees~18 degrees with the vertical line of the horizontal plane. More preferably, the rotation central axes of the first through holes 410-1 and 410-2 may be at an angle of 7 degrees~15 degrees with the vertical line of the horizontal plane. More preferably, the central axes of rotation of the first through holes 410-1 and 410-2 may be at an angle of 9 degrees~13 degrees with the vertical line of the horizontal plane. More preferably, the rotation central axes of the first through holes 410-1 and 410-2 may be at an angle of 11 degrees~12 degrees with the vertical line of the horizontal plane. A distance between the centers of the two through holes may be 70 mm~150 mm. Preferably, the distance between the centers of the two through holes may be 80 mm~140 mm. More preferably, the distance between the centers of the two through holes may be 90 mm~130 mm. More preferably, the distance between the centers of the two through holes may be 100 mm~120 mm. More preferably, the distance between the centers of the two through holes may be 105 mm~115 mm. More preferably, the distance between the centers of the two through holes may be 107 mm~113 mm. More preferably, the distance between the centers of the two through holes may be 109 mm~111 mm.

Figure 5:
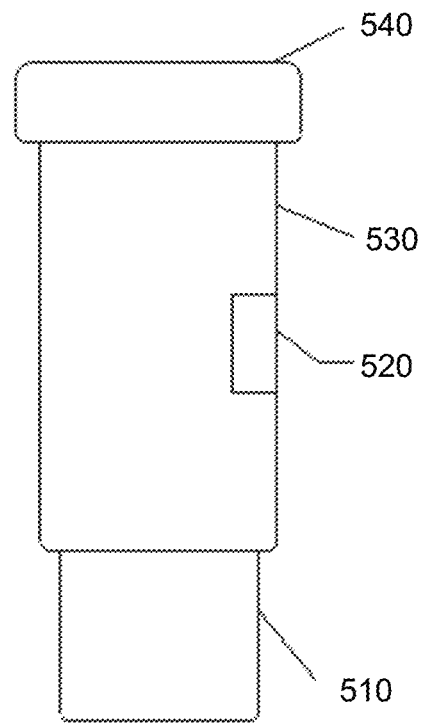
FIG. 5 is a schematic diagram illustrating an exemplary observation unit according to some embodiments of the present disclosure.

In some embodiments, the first through holes 410-1 and 410-2 may be provided with an observation unit 218. Since a crystal growth period is relatively long (e.g., 4-40 days), a unit through which the internal situation of the temperature field device 200 can be observed may be mounted on the temperature field device 200. A user (e.g., a worker in a factory) can observe the growth of the crystal through the observation unit 218. If an abnormal situation is found, a timely remedial action can be executed. FIG. 5 is a schematic diagram illustrating an exemplary observation unit according to some embodiments of the present disclosure. The observation unit 218 may include a tubular unit with a closed end and an open end. The observation unit 218 may include a first part 510. A size of the first part 510 may be matched with the first through hole 410-1/410-2 of the first cover plate 210, thereby realizing a connection between the observation unit 218 and the first cover plate 210, for example, via a riveting connection, a screw connection, etc. Meanwhile, a lower end of the first port 510 may be open, accordingly, after the observation unit 218 is connected with the first cover plate 210, a connection between an inner chamber of the observation unit 218 and the first through hole 410-1/410-2 can be achieved. According to the diameter of the first through hole 410-1/410-2, a diameter of the first part 510 may be 15 mm~30 mm. Preferably, the diameter of the first part 510 may be 18 mm~27 mm. More preferably, the diameter of the first part 510 may be 20 mm~25 mm. More preferably, the diameter of the first part 510 may be 21 mm~24 mm. More preferably, the diameter of the first part 510 may be 22 mm~23 mm. The observation unit 218 may further include a second through hole 520. The second through hole 520 may be mounted at any position of a second part 530 of the observation unit 218, and communicate with the internal chamber of the observation unit 218. After that the observation unit 218 is connected to the first through hole 410-1/410-2, the second through hole 520 may be used to get gas passing through. In some embodiments, a diameter of the second through hole 520 may be 3 mm~10 mm. Preferably, the diameter of the second through hole 520 may be 4 mm~9 mm. More preferably, the diameter of the second through hole 520 may be 5 mm~8 mm. More preferably, the diameter of the second through hole 520 may be 6 mm~7 mm. The second part 530 may include a part of the observation unit 218 that is protruded outside the first cover plate 210 after that the observation unit 218 is connected to the first through hole 410-1/410-2, and its height may be 50 mm~100 mm. Preferably, the height of the second part 530 may be 60 mm~90 mm. More preferably, the height of the second part 530 may be 70 mm~80 mm. More preferably, the height of the second part 530 may be 71 mm~79 mm. More preferably, the height of the second part 530 may be 72 mm~78 mm. More preferably, the height of the second part 530 may be 73 mm~77 mm. More preferably, the height of the second part 530 may be 74 mm~76 mm. In some embodiments, a diameter of the second part 530 may be 26 mm~66 mm. Preferably, the diameter of the second part 530 may be 30 mm~60 mm. More preferably, the diameter of the second part 530 may be 35 mm~55 mm. More preferably, the diameter of the second part 530 may be 40 mm~50 mm. More preferably, the diameter of the second part 530 may be 41 mm~49 mm. More preferably, the diameter of the second part 530 may be 42 mm~48 mm. More preferably, the diameter of the second part 530 may be 43 mm~47 mm. More preferably, the diameter of the second part 530 may be 44 mm~46 mm. The observation unit 218 may also include an observation window 540. The observation window 540 may be mounted on a top of the observation unit 218, and may be made of a transparent material, such as quartz, polymethyl methacrylate (PMMA), polystyrene (PS), polycarbonate (PC), or the like, or any combination thereof. The user (e.g., the worker in the factory) may observe an internal situation of the temperature field device 200 through the observation window 540.

Similarly, in order to reduce heat radiation emitted above the temperature field device 200, the first cover plate 210 may be provided with channel(s) for circulation cooling fluid. As shown in FIG. 4, the first cover plate 210 may include a channel 420 for circulation cooling fluid. A cooling liquid may flow through the channel 420. The cooling liquid may include water, ethanol, ethylene glycol, isopropyl alcohol, n-hexane, or the like, or any combination thereof. For example, the cooling liquid may include a 50:50 mixed liquid of water and ethanol. Through cooling liquid inlets 430-1 and/or 430-2, the cooling liquid may flow into the circulating cooling liquid channels 440-1, 440-2, and 440-3, which may be mounted in the first cover plate 210. After absorbing heat dissipated from the temperature field device 200, the cooling liquid may flow out from the cooling liquid outlet 430-3. The cooling liquid may be returned to the cooling liquid channel 420 through other channels, and a next cycle may be performed. In some embodiments, the diameter of the circulating cooling liquid channels 440-1, 440-2, and 440-3 may be 5 mm~25 mm. Preferably, the diameter of the circulating cooling liquid channels 440-1, 440-2, and 440-3 may be 10 mm~20 mm. More preferably, the diameter of the circulating cooling liquid channels 440-1, 440-2, and 440-3 may be 11 mm~19 mm. More preferably, the diameter of the circulating cooling liquid channels 440-1, 440-2, and 440-3 may be 12 mm~18 mm. More preferably, the diameter of the circulating cooling liquid channels 440-1, 440-2, and 440-3 may be 13 mm~17 mm. More preferably, the diameter of the circulating cooling liquid channels 440-1, 440-2, 440-3 may be 14 mm and 15 mm.

In some embodiments, the first cover plate 210 may further include a third through hole 450. For example, when the crystal growth is executed based on the Czochralski technique, a channel (e.g., the third through hole 450) for entrance and/or exit of the pulling rod 200 into and/or from the temperature field device 200 may be mounted on the first cover plate 210. The pulling rod may include an iridium pulling rod. The third through hole 450 may be mounted at a center of the first cover plate 210. A size of the third through hole 450 may be determined based on a size of the pulling rod. In some embodiments, a shape of the third through hole 450 may be various. The shape of the third through hole 450 may include a regular shape, a square shape, a rectangle shape, a rhombus shape, a regular triangle shape, or any other irregular shape. In some embodiments, an area of the third through hole 450 may be 100 mm$^2$~3000 mm$^2$. Preferably, the area of the third through hole 450 may be 200 mm$^2$~2900 mm$^2$. More preferably, the area of the third through hole 450 may be 300 mm$^2$~2800 mm$^2$. More preferably, the area of the third through hole 450 may be 400 mm$^2$~2700 mm$^2$. More preferably, the area of the third through hole 450 may be 500 mm$^2$~2600 mm$^2$. More preferably, the area of the third through hole 450 may be 600 mm$^2$~2500 mm$^2$. More preferably, the area of the third through hole 450 may be 700 mm$^2$~2400 mm$^2$. More preferably, the area of the third through hole 450 may be 800 mm$^2$~2300 mm$^2$. More preferably, the area of the third through hole 450 may be 900 mm$^2$~2200 mm$^2$. More preferably, the area of the third through hole 450 may be 1000 mm$^2$~2100 mm$^2$. More preferably, the area of the third through hole 450 may be 1100 mm$^2$~2000 mm$^2$. More preferably, the area of the third through hole 450 may be 1200 mm$^2$~1900 mm$^2$. More preferably, the area of the third through hole 450 may be 1300 mm$^2$~1800 mm$^2$. More preferably, the area of the third through hole 450 may be 1400 mm$^2$~1700 mm$^2$. More preferably, the area of the third through hole 450 may be 1500 mm$^2$~1600 mm$^2$. When the third through hole 450 is a circular through hole, its diameter may be 25 mm~30 mm. Preferably, the diameter of the circular through hole may be 26 mm~29 mm. More preferably, the diameter of the circular through hole may be 27 mm~28 mm.

The second cover plate 212 may be mounted in the first drum 204, cover the open end of the second drum 206 near the first cover plate 210, and may be connected to the second drum 206 via a welding connection, a riveting connection, a bolt connection, a bonding connection, or the like, or any combination thereof. In some embodiments, the second cover plate 212 may be made of a material with a relatively good heat preservation performance to perform the heat preservation function. The second cover plate 212 may include alumina plate, a zirconia plate, a ceramic plate, a metal plate, etc. In some embodiments, a diameter of the second cover plate 212 may be determined based on the inner diameter of the first drum 204. The second cover plate 212 may fit the inner wall of the first drum 204. The second cover plate 212 may cover one end of the second drum 206, thereby preventing the filler 208 filled in the space between the first drum 204 and the second drum 206 from falling out and polluting the reactants in the crucible 214. In order to observe the internal situation of the temperature field device 200 from outside in existence of the second cover plate 212, through holes (also referred to as fourth through holes) corresponding to the through holes (e.g., the first through hole 410-1/410-2, the third through hole 450) on the first cover plate 210 may be mounted on the second cover plate 212. Rotation central axes of the fourth through holes may be the same as or similar to that of the first and/or the third through holes. That is, the fourth through holes may be mounted on the second cover plate 212 along the rotation central axes of the first and/or third through holes. In some embodiments, diameters of the fourth through holes corresponding to the first through hole 410-1/410-2 may be 8 mm~15 mm. Preferably, the diameters of the fourth through holes corresponding to the first through hole 410-1/410-2 may be 9 mm~14 mm. More preferably, the diameters of the fourth through holes corresponding to the first through hole 410-1/410-2 may be 10 mm~13 mm. More preferably, the diameters of the fourth through holes corresponding to the first through hole 410-1/410-2 may be 11 mm~12 mm. The rotation center axes of the fourth through holes corresponding to the first through hole 410-1/410-2 may be at an angle of 3 degrees~20 degrees with a vertical line of the horizontal plane. Preferably, the rotation center axes of the fourth through holes corresponding to the first through hole 410-1/410-2 may be at an angle of 5 degrees~18 degrees with the vertical line of the horizontal plane. More preferably, the rotation center axes of the fourth through holes corresponding to the first through hole 410-1/410-2 may be at an angle of 7 degrees~15 degrees with the vertical line of the horizontal plane. More preferably, the rotation center axes of the fourth through holes corresponding to the first through hole 410-1/410-2 may be at an angle of 9 degrees~13 degrees with the vertical line of the horizontal plane. More preferably, the rotation center axes of the fourth through holes corresponding to the first through hole 410-1/410-2 may be at an angle of 11 degrees~12 degrees with the vertical line of the horizontal plane. A distance between the centers of the fourth through holes corresponding to the first through holes 410-1/410-2 may be 60 mm~120 mm. Preferably, the distance between the centers of the fourth through holes corresponding to the first through holes 410-1/410-2 may be 70 mm~120 mm. More preferably, the distance between the centers of the fourth through holes corresponding to the first through holes 410-1/410-2 may be 80 mm~110 mm. More preferably, the distance between the centers of the fourth through holes corresponding to the first through holes 410-1/410-2 may be 90 mm~100 mm. More preferably, the distance between the centers of the fourth through holes corresponding to the first through holes 410-1/410-2 may be 91 mm~99 mm. More preferably, the distance between the centers of the fourth through holes corresponding to the first through holes 410-1/410-2 may be 92 mm~98 mm. More preferably, the distance between the centers of the fourth through holes corresponding to the first through holes 410-1/410-2 may be 93 mm~97 mm. More preferably, the distance between the centers of the fourth through holes corresponding to the first through holes 410-1/410-2 may be 94 mm~96 mm. In some embodiments, a diameter of a fourth through hole corresponding to the third through hole may be 15 mm~50 mm. Preferably, the diameter of the fourth through hole corresponding to the third through hole may be 20 mm~45 mm. More preferably, the diameter of the fourth through hole corresponding to the third through hole may be 25 mm~40 mm. More preferably, the diameter of the fourth through hole corresponding to the third through hole may be 30 mm~35 mm. More preferably, the diameter of the fourth through hole corresponding to the third through hole may be 31 mm~34 mm. More preferably, the diameter of the fourth through hole corresponding to the third through hole may be 32 mm~33 mm. The diameter of the fourth through hole corresponding to the third through hole may affect the amount of heat dissipated from it, thereby affecting the temperature gradient of the temperature field device 200. In this case, the temperature gradient of the temperature field device 200 may be adjusted by changing the diameter of the fourth through hole corresponding to the third through hole. In some embodiments, an automatic feeder may be mounted at the fourth through hole corresponding to the first through hole 410-1/410-2, which can automatically add the reactants to the crucible 214. In this case, a concentration gradient caused by the reactants during the crystal growth may be constant, thereby improving the uniformity and consistency of the crystal growth.

In some embodiments, a thickness of the second cover plate 212 may be 20 mm~35 mm. Preferably, the thickness of the second cover plate 212 may be 25 mm~30 mm. More preferably, the thickness of the second cover plate 212 may be 26 mm~29 mm. More preferably, the thickness of the second cover plate 212 may be 27 mm~28 mm. In some embodiments, a position of the second cover plate 212 in the temperature field device 200 may be determined based on the length and/or the position of the second drum 206. When the length of the second drum 206 is greater than a length threshold, the second cover plate 212 may be close to the first cover plate 210. A certain distance may be maintained between the second cover plate 212 and the first cover plate 210.

The sealing ring 220 and/or the pressure ring 222 may achieve a seal between the first drum 204 and the first cover plate 210. In some embodiments, the sealing ring 220 may be mounted at a joint between the first drum 204 and the first cover plate 210, which may made of a material having a certain elasticity, for example, silicone, rubber, etc. An inner diameter of the sealing ring 220 may be less than or equal to the outer diameter of the first drum 114, so that when the sealing ring 220 is mounted, the sealing ring 220 may be stretched to seal effectively a gap between the first drum 204 and the first cover plate 210. In some embodiments, the inner diameter of the sealing ring 220 may be 170 mm~540 mm. Preferably, the inner diameter of the sealing ring 220 may be 200 mm~510 mm. More preferably, the inner diameter of the sealing ring 220 may be 250 mm~350 mm. More preferably, the inner diameter of the sealing ring 220 may be 260 mm~340 mm. More preferably, the inner diameter of the sealing ring 220 may be 270 mm~330 mm. More preferably, the inner diameter of the sealing ring 220 may be 280 mm~320 mm. More preferably, the inner diameter of the sealing ring 220 may be 290 mm~310 mm. A wire diameter of the sealing ring 220 may be 5 mm~10 mm. Preferably, the wire diameter of the sealing ring 220 may be 6 mm~9 mm. More preferably, the wire diameter of the sealing ring 220 may be 7 mm~8 mm.

The pressure ring 222 may be configured to perform a fixing and compressing function for the sealing ring 220. In some embodiments, a shape of the pressure ring 222 may match the shape of the first drum 204, and an inner diameter of the pressure ring 222 may be larger than the outer diameter of the first drum 204. The pressure ring 222 may be nested on the first drum 204 and may be movable. The pressure ring 222 may include a threaded hole corresponding to the first cover plate 210. The sealing ring 220 may be mounted between the pressure ring 222 and the first cover plate 210. The pressure ring 222 may be connected to the first cover plate 210 via a thread, thereby compressing the sealing ring 220, enlarging a contact surface of the gap between the first drum 204 and the first cover plate 210, causing the contact tightly, and performing an effective sealing function. In some embodiments, one or more items may be used to perform the sealing function, for example, vacuum grease. The sealing ring 220 may be covered with the vacuum grease to perform more effective sealing function. In some embodiments, the pressure ring 222 and the first cover plate 210 may also be connected via a buckle connection. In some embodiments, an outer diameter of the pressure ring 222 may be 200 mm~500 mm. Preferably, the outer diameter of the pressing ring 222 may be 250 mm~450 mm. More preferably, the outer diameter of the pressing ring 222 may be 300 mm~400 mm. More preferably, the outer diameter of the pressing ring 222 may be 310 mm~390 mm. More preferably, the outer diameter of the pressure ring 222 may be 320 mm~380 mm. More preferably, the outer diameter of the pressing ring 222 may be 430 mm~370 mm. More preferably, the outer diameter of the pressing ring 222 may be 440 mm~360 mm. More preferably, the outer diameter of the pressing ring 222 may be 345 mm~355 mm. An inner diameter of the pressure ring 222 may be 190 mm~460 mm. Preferably, the inner diameter of the pressing ring 222 may be 220 mm~530 mm. More preferably, the inner diameter of the pressing ring 222 may be 250 mm~400 mm. More preferably, the inner diameter of the pressure ring 222 may be 280 mm~520 mm. More preferably, the inner diameter of the pressing ring 222 may be 300 mm~400 mm. More preferably, the inner diameter of the pressing ring 222 may be 310 mm~390 mm. More preferably, the inner diameter of the pressing ring 222 may be 320 mm~380 mm. More preferably, the inner diameter of the pressure ring 222 may be 430 mm~370 mm. More preferably, the inner diameter of the pressure ring 222 may be 440 mm~360 mm. More preferably, the inner diameter of the pressure ring 222 may be 345 mm~355 mm. A thickness of the pressing ring 222 may be 8 mm~15 mm. More preferably, the thickness of the pressing ring 222 may be 10 mm~13 mm. More preferably, the thickness of the pressing ring 222 may be 11 mm~12 mm.

In some embodiments, the temperature field device 200 may further include a gas channel 224. The gas channel 224 may be mounted on the observation unit 218, and a size of the gas channel 224 may match with that of the through hole 520 to form a through tube protruding from the observation unit 218. In this case, the gas channel 224 may be connected to a vent tube to pass the gas into the temperature field device 200.

In some embodiments, the temperature field device 200 may be applied in crystal growth. The reactants for growing crystals may be placed in the crucible 214 for reaction after being weighed and performed a processing operation (e.g., a high temperature roasting operation, a room temperature mixing operation, an isostatic pressing operation) according to a reaction equation for preparing the crystal. Different crystal may need different growth conditions, for example, different temperature gradients. Accordingly, the temperature gradient may be adjusted by adjusting an amount and a tightness of the filler 208 (e.g., the filler 208 filled in the second drum 206) filled in the temperature field device 200. For example, the amount of the filler 208 may determine a relative position of the crucible 214 and the induction coil 216, and further determine a heating center of the temperature field device 200. The tightness of the filler 208 may improve the heat preservation capacity of the filler 208 and the stability of the temperature field device 200, which may be beneficial for the crystal growth. After the amount, the particle size, and the tightness of the filler 208 are determined, other components may be mounted and sealed. After the components are mounted, a gas may be introduced into the temperature field device 200, and an auxiliary component (e.g., a cooling circulation pump) may be activated to pass a cooling fluid into circulating cooling liquid channel (s), which may be mounted in the bottom plate 202 and the first cover plate 210. Then, the crystal growth device (including the temperature field device 200) may be activated to start the crystal growth. The gas passing into temperature field device 200 may enter from one or more first through holes (e.g., the gas channels 224). The gas exiting the temperature field device 200 may be discharged through the remaining first through holes (e.g., the gas channel 224). After the temperature is adjusted as suitable, an automatic control program may be started to enter an automatic growth mode, through a necking process, a shouldering process, a constant diameter growth process, an ending process, and a cooling process, the crystal growth may be ended after several days (e.g., 4-40 days).

Figure 6:
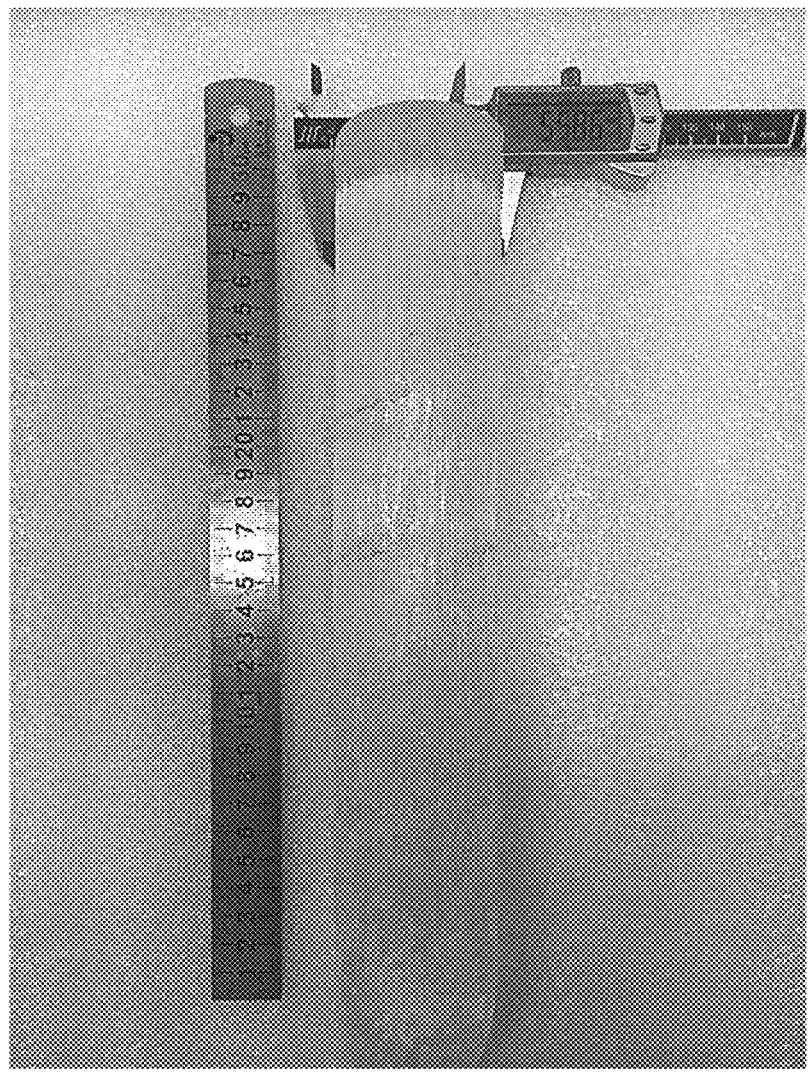
FIG. 6 is a schematic diagram illustrating an exemplary image of an LSO crystal according to some embodiments of the present disclosure.
Figure 7:
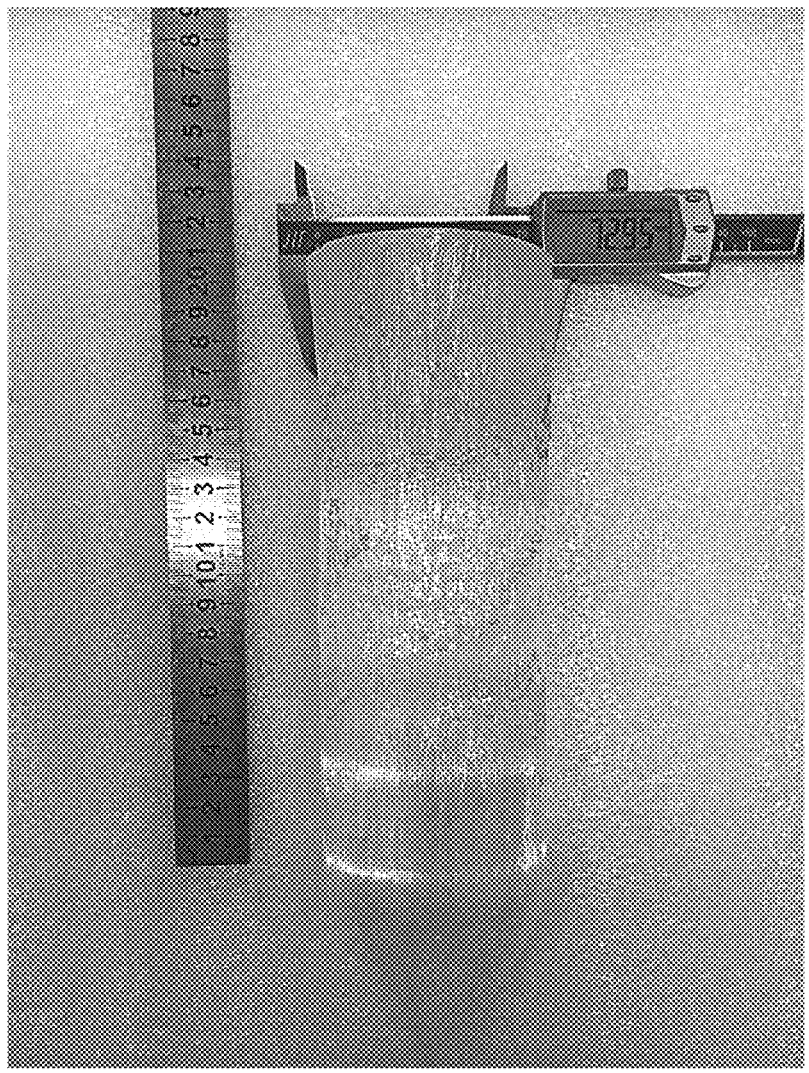
FIG. 7 is a schematic diagram illustrating an exemplary image of an L(Y)SO crystal according to some embodiments of the present disclosure.

FIG. 6 is a schematic diagram illustrating an exemplary image of an LSO crystal according to some embodiments of the present disclosure. FIG. 7 is a schematic diagram illustrating an exemplary image of an L(Y)SO crystal according to some embodiments of the present disclosure. As shown in FIG. 6 and FIG. 7, a length of the LSO crystal is 30 cm and a diameter of the LSO crystal is 55 mm; a length of the L(Y)SO crystal is 20 cm and a diameter of the L(Y)SO crystal is 73 mm. The LSO crystal and L(Y)SO crystal have complete appearance, no cracks, no clouds, no misalignment, and no structural defects. The light yield of the crystals is greater than 32000 photons/megaelectron electron volt.

According to the devices and the methods for growing crystals, excess reactants (e.g., silicon dioxide) are used and a flowing gas is introduced, which can reduce or avoid composition deviation caused by volatility of the reactants during the growth process and improve the crystal performance consistency and growth repeatability. Further, an improved temperature field device can provide a temperature field with good temperature gradient and good uniformity for the growth of crystal, which may reduce crack of the crystal. In addition, a heater may be used in the temperature field device to provide the crystal with the temperature for annealing. The oxygen-rich flowing gas may be introduced into the temperature field device to solve a problem of oxygen vacancy during the growth of crystal. In addition, a processing operation may be performed on the crystal growth device to prevent device oxidation problem(s) caused by oxygen-rich conditions. By optimizing the parameters of the crystal growth process, the crystal performance consistency is improved. It should be noted that different embodiments may have different beneficial effects. In different embodiments, the possible beneficial effects may have one or more above described beneficial effects, or any other beneficial effect.

The present disclosure may be further described according to the following embodiments.

Embodiment 1—The Installation of the Temperature Field Device 200

In step 1, the bottom plate 202 may be mounted on an aluminum plate of a crystal growth device. A level of the bottom plate 202 may be adjusted to 0.02 mm/m.

In step 2, the second drum 206 may be mounted on the bottom plate 202, and a concentricity and a verticality between the second drum 206 and bottom plate 202 may be adjusted. The concentricity between the second drum 206 and the bottom plate 202 may be less than 0.5 mm and the perpendicularity between the second drum 206 and the bottom plate 202 may be less than 0.2 degrees.

In step 3, the first drum 204 may be mounted on the bottom plate 202, and a concentricity and a verticality between the first drum 204 and bottom plate 202 may be adjusted. The concentricity between the first drum 204 and the bottom plate 202 may be less than 0.5 mm and the perpendicularity of the first drum 204 and the bottom plate 202 may be less than 0.2 degrees. A high-temperature adhesive may be used to seal a joint between the first drum 204 and the bottom plate 202, thereby ensuring a positive pressure and avoiding gas leakage.

In step 4, the filler 208 may be filled in the space between the first drum 204 and the second drum 206, and filled in the bottom of the second drum 206. The amount and the tightness of the filler 208 may be determined according to a growth condition of the crystal.

In step 5, the crucible 214 may be placed on the filler 208 filled in the bottom of the second drum 206. A vertical distance between an upper edge of the crucible 214 and an upper edge of the induction coil 216 may be −20 mm~6 mm. "−" represents that the upper edge of crucible 214 is below the upper edge of induction coil 216, "0" represents that the upper edge of crucible 214 is flush with the upper edge of induction coil 216, "+" represents that the upper edge of the crucible 214 is higher than the upper edge of the induction coil 216. The vertical distance between the upper edge of the crucible 214 and the upper edge of the induction coil 216 may be determined according to the growth condition of the crystal to be grown.

In step 6, the heater 226 may be mounted above the crucible 214.

In step 7, the second cover plate 212 may be mounted above the second drum 206, and a concentricity among the second cover plate 212, the first drum 204, and the second drum 206 may be adjusted.

In step 8, the pressure ring 222 and the sealing ring 220 coated with vacuum grease may be mounted.

In step 9, the first cover plate 210 may be mounted above the first drum 204, and a concentricity between the first cover plate 210 and the first drum 204 may be adjusted to ensure that the first through-hole(s) (e.g., the first through-hole 410-1/410-2) on the first cover plate 210 may have the same axis with the fourth through-hole(s) corresponding to the second cover plate 212. The pressure ring 222 and the first cover plate 210 may be connected via a thread connection and the sealing ring 220 may be pressed to achieve the sealing function, ensure a positive pressure, and avoid gas leakage.

In step 10, the observation unit 218 may be mounted on the first cover plate 210 and a vent pipe may be connected to the gas channel 224. Then the temperature field device 200 would be installed.

Example of Ce:LSO Crystal Growth

The crystal may be prepared using the Czochralski technique via a medium frequency induction heating mode and a single crystal growth induction furnace with an open furnace. A temperature field device may be mounted according to the steps 1-5 described in embodiment 1. Reactants with purity of 99.999% may be taken out after a roasting process is performed on the reactants at 1000° C. for 5 hours and the reactants are naturally cooled to room temperature 35° C. The reactants may be weighted based on a molar ratio of the reactants according to the following reaction equation:

$$(1-x)Lu_2O_3 + SiO_2 + 2xCeO_2 \rightarrow Lu_{2(1-x)}Ce_{2x}SiO_5 + x/2O_2 \uparrow$$

where x=0.16%, a weight of $SiO_2$ may excess of 0.2% of its weight or the total weight of the reactants, and other reactants may be weighted according to the stoichiometric ratio in the reaction equation. After being weighted, the reactants may be placed in a three-dimensional mixer for 0.5-48 hours, and then taken out and placed in a pressing mold and pressed into a cylindrical shape by a cold isostatic pressing device with a pressure of 100-300 MPa. The reactants may be placed in an iridium crucible with a diameter of 120 mm and a height of 120 mm. The iridium crucible may be placed in the mounted temperature field device. A concentricity between the iridium crucible and the temperature field device may be adjusted and a crucible position of the iridium crucible may be set as +20 mm. A concentricity among the iridium crucible 214, the heater 226, the second cover plate 212, the first cover plate 210, and the weighing guide rod may be successively adjusted. The seal of the first cover plate 210 and the first drum 204 may be ensured. After the observation unit 218 is mounted on the first cover plate 210, a mixed flowing gas of $N_2$ and $O_2$ may be introduced into the temperature field device, wherein a volume ratio of oxygen may be 10% of the mixed flowing gas and a gas flow rate may be 30 L/min. Parameters of the crystal growth may be set. For example, a diameter of the crystal may be set as 55 mm, a shoulder length may be set as 55 mm, a length of a constant diameter may be set as 600 mm, an ending length may be set as 50 mm, a heating time may be set as 24 hours, a rotation rate may be set as 10 rpm, a pulling rate may be set as 2 mm/h, a cooling time may be set as 60 hours, a PID value may be set as 0.5, a crystal density may be set as 7.4 g/cm³, and a melt density may be set as 6.3 g/cm³. After the parameters are set, a seed crystal of Ce:LSO may be placed on a top of a pulling rod which may be connected to a weighing guide rod and a concentricity between the seed crystal and the first cover plate 210 may be adjusted. The temperature may be increased to melt the reactants. During rising temperature, the seed crystal may be dropped for preheating. To avoid cracking of seed crystal, a distance between the seed crystal and a surface of the reactants may be kept as 5 mm~15 mm. After the reactants are melt, the seed crystal may be dropped to contact the melt and the temperature may be adjusted. During adjusting the temperature, the seed crystal may be sunk 2 mm to effectively contact with the melt, ensure interface integrity, and reduce crystal cracking caused by a seeding point during a subsequent cooling process. After the temperature is adjusted as suitable, an automatic control program may be started to enter an automatic growth mode. After a necking process, a shouldering process, a constant diameter growth process, an ending process, and a cooling process, the crystal growth may end after 14 days.

A color of the crystal is white, a shape of the crystal is normal as a preset shape, a surface of the crystal is rough, and there is a slight melt back strip. After a head and a tail of the crystal are removed and the remaining portions are polished, an interior of the crystal is transparent. When being irradiated by x laser, the crystal has no macro defects such as point scattering, a cloud layer, a wrapping material, etc. Through a testing process, the lattice parameters of the crystal are a=1.4254 nm, b=0.6641 nm, c=1.0241 nm, and β=122°12″. A transmittance of the crystal from ultraviolet, visible light, to near-infrared band is greater than 80%. A center wavelength of the crystal is 420 nm, a Light yield is greater than or equal to 58000 photons/megaelectron electron volt, an energy resolution may be less than or equal to 6.5%, and a decay time is less than or equal to 30 nanoseconds.

Example of Ce:LYSO Crystal Growth

The crystal may be prepared using the Czochralski technique via a medium frequency induction heating mode and a single crystal growth induction furnace with an open furnace. A temperature field device may be mounted according to the steps 1 to 5. Reactants with purity of 99.999% may be taken out after a roasting process is performed on the reactants at 1000° C. for 5 hours and the reactants are naturally cooled to room temperature 35° C. The reactants may be weighted based on a molar ratio of the reactants according to the following reaction equation:

$$(1-x-y)Lu_2O_3 + yY_2O_3 + SiO_2 + 2xCeO_2 \rightarrow Lu_{2(1-x-y)}Y_{2y}Ce_{2x}SiO_5 + x/2O_2 \uparrow \qquad (2)$$

where x=0.16%, y=20%, a weight of $SiO_2$ may excess of 2% of its weight or the total weight of the reactants, other reactants may be weighed according to the stoichiometric ratio in the reaction equation. After being weighted, the reactants may be placed in a three-dimensional mixer for 1-6 hours, and then taken out and placed in a pressing mold and pressed into a cylindrical shape by a cold isostatic pressing device with a pressure of 200 MPa. The reactants may be placed in an iridium crucible with a diameter of 180 mm and a height of 180 mm. The iridium crucible may be placed in the mounted temperature field device. A concentricity between the iridium crucible and the temperature field device may be adjusted and a crucible position of the iridium crucible may be set as +20 mm. A concentricity among the iridium crucible 214, the heater 226, the second cover plate 212, the first cover plate 210, and the weighing guide rod may be successively adjusted. The seal of the first cover plate 210 and the first drum 204 may be ensured. After the observation unit 218 is mounted on the first cover plate 210, a mixed flowing gas of $N_2$ and $O_2$ may be introduced into the temperature field device, wherein a volume ratio of oxygen may be 10% of the mixed flowing gas and a gas flow rate may be 30 L/min. Parameters of the crystal growth may be set. For example, a diameter of the crystal may be set as 95 mm, a shoulder length may be set as 95 mm, a length of a constant diameter may be set as 200 mm, an ending length may be set as 70 mm, a heating time may be set as 24 hours, a rotation rate may be set as 10 rpm, a pulling rate may be set as 1.5 mm/h, a cooling time may be set as 100 hours, a PID value may be set as 0.5, a crystal density may be set as 7.25 g/cm$^3$, and a melt density may be set as 6.15 g/cm$^3$. After the parameters are set, a seed crystal of Ce:LYSO may be placed on a top of a pulling rod which may be connected to a weighing guide rod and a concentricity between the seed crystal and the first cover plate 210 may be adjusted. The temperature may be increased to melt the reactants. During rising temperature, the seed crystal may be dropped for preheating. To avoid cracking of seed crystal, a distance between the seed crystal and a surface of the reactants may be kept as 5 mm~15 mm. After the reactants are melt, the seed crystal may be dropped to contact the melt and the temperature may be adjusted. During adjusting the temperature, the seed crystal may be sunk 2 mm to effectively contact with the melt, ensure interface integrity, and reduce crystal cracking caused by a seeding point during a subsequent cooling process. After the temperature is adjusted as suitable, an automatic control program may be started to enter an automatic growth mode to enter a necking process, a shouldering process, a constant diameter growth process, an ending process, and a cooling process. During the cooling process, the volume ratio of oxygen may be 20% of the mixed flowing gas when the temperature drops to 1300° C. The volume ratio of oxygen may be 10% of the mixed flowing gas when the temperature drops to or below 800° C. The crystal growth may end after 16 days.

A color of the crystal is white, a shape of the crystal is normal as a preset shape, a surface of the crystal is rough, and there is a slight melt back strip. After a head and a tail of the crystal are removed and the remaining portions are polished, an interior of the crystal is transparent. When being irradiated by x laser, the crystal has no macro defects such as point scattering, a cloud layer, a wrapping material, etc. Through a testing process, the lattice parameters of the crystal are a=1.4254 nm, b=0.6641 nm, c=1.0241 nm, and $\beta$=122°12". A transmittance of the crystal from ultraviolet, visible light, to near-infrared band is greater than 80%. A center wavelength of the crystal is 420 nm, a Light yield is greater than or equal to 60000 photons/megaelectron electron volt, an energy resolution may be less than or equal to 6%, and a decay time is less than or equal to 35 nanoseconds.

It should be noted that the above description for the basic concepts is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about" "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict the description, definition, and/or the use of a term associated with any of the incorporated material and that associated with the present document, the description, definition, and/or the use of the term in the present document shall prevail.

We claim:

1. A method for growing a crystal, comprising:
weighting reactants based on a molar ratio of the reactants according to a reaction equation for generating the crystal after a first preprocessing operation is performed on the reactants, wherein the first preprocessing operation includes a roasting operation under 800° C.~1400° C.;
placing the reactants, on which a second preprocessing operation has been performed, into a crystal growth device after an assembly preprocessing operation is performed on a crucible of the crystal growth device, wherein
the second preprocessing operation includes at least one of a reactants mixing operation or a pressing operation at room temperature; and
the assembly processing operation includes at least one of a coating operation, an acid soaking and cleaning operation, or an impurity cleaning operation;
introducing a flowing gas into the crystal growth device after sealing the crystal growth device, the flowing gas including a mixed gas of oxygen and one or more of nitrogen and inert gas;
operating the crystal growth device to execute a crystal growth operation based on Czochralski technique, wherein the crystal growth operation at least includes a process for melting the reactants, a growing process, and a cooling process, wherein during the cooling process:
when a temperature drops to 1400° C.~800° C., increasing a volume ratio of oxygen in the flowing gas from an initial volume ratio of oxygen in the flowing gas to 20%~30% and reducing an initial cooling rate of the cooling process; and
when the temperature drops below 800° C., decreasing the volume ratio of oxygen in the flowing gas to 1%-20%.

2. The method of claim 1, wherein the crystal includes gadolinium aluminum gallium garnet (GAGG), yttrium aluminum garnet (YAG), lutetium orthosilicate (LSO), lutetium yttrium orthosilicate (LYSO), gadolinium yttrium oxy orthosilicate (GYSO), terbium gallium garnet (TGG), gadolinium gallium garnet (GGG), yttrium orthovanadate (YVO4), gadolinium orthosilicate (GSO), sapphire, or a doped crystal thereof.

3. The method of claim 1, wherein the crystal includes cerium-doped LSO or cerium-doped LYSO, and the weighting the reactants based on the molar ratio of the reactants according to the reaction equation for generating the crystal after the first preprocessing operation is performed on the reactants includes:
weighting the reactants based on the molar ratio of the reactants according to a reaction equation (1) or a reaction equation (2) after the first preprocessing operation is performed on the reactants:

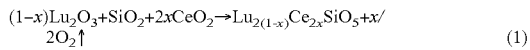 (1)

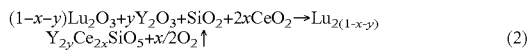 (2)

where x=[0.0001%, 6%], y=(0, 100%), and a weight range of $SiO_2$ being 0.01%~10% in excess of a weight of $SiO_2$ calculated according to the reaction equation (1) or the reaction equation (2).

4. The method of claim 1, wherein a purity of each of the reactants is greater than 99%.

5. The method of claim 1, wherein a flow rate of the flowing gas is 10 L/min~40 L/min.

6. The method of claim 1, wherein the initial volume ratio of oxygen in the flowing gas is 0.001%~20%.

7. The method of claim 1, wherein a purity of each of the reactants is greater than 99.9%.

8. The method of claim 1, wherein the initial cooling rate is within a range of 65° C./h~95° C./h.

9. The method of claim 1, wherein the initial cooling rate is within a range of 55° C./h~65° C./h.

10. The method of claim 1, wherein the initial cooling rate is within a range of 15° C./h~19° C./h.

11. The method of claim 1, wherein a cooling time of the cooling process is 20 hours~100 hours.

12. The method of claim 1, wherein a cooling time of the cooling process is 50 hours~70 hours.

13. The method of claim 1, wherein a cooling time of the cooling process is 55 hours~65 hours.

* * * * *